(12) United States Patent
Eckstein et al.

(10) Patent No.: US 7,856,708 B2
(45) Date of Patent: Dec. 28, 2010

(54) PROCESS FOR FORMING AT LEAST A PORTION OF A PACKAGE OR AN ENVELOPE BEARING A PRINTED INDICIA

(75) Inventors: Eric Eckstein, Merion Station, PA (US); Andre Cote, Williamstown, NJ (US)

(73) Assignee: Checkpoint Systems, Inc., Thorofare, NJ (US)

(*) Notice: Subject to any disclaimer, the term of this patent is extended or adjusted under 35 U.S.C. 154(b) by 1009 days.

(21) Appl. No.: 11/532,715

(22) Filed: Sep. 18, 2006

(65) Prior Publication Data
US 2007/0113966 A1    May 24, 2007

Related U.S. Application Data

(63) Continuation of application No. 10/996,786, filed on Nov. 24, 2004, now Pat. No. 7,384,496.

(60) Provisional application No. 60/611,349, filed on Sep. 20, 2004, provisional application No. 60/547,235, filed on Feb. 23, 2004.

(51) Int. Cl.
*H05K 3/02* (2006.01)

(52) U.S. Cl. .............. 29/847; 29/832; 29/846; 156/60; 156/249; 156/265; 156/267; 156/277

(58) Field of Classification Search ........... 29/847, 29/592.1, 606, 738, 832, 846, DIG. 40; 156/60, 156/152, 249, 265, 267, 277, 300, 555; 340/551, 340/571, 572.1, 572.5, 572.8
See application file for complete search history.

(56) References Cited

U.S. PATENT DOCUMENTS

| | | | |
|---|---|---|---|
| 3,911,534 A | 10/1975 | Martens et al. | |
| 3,913,219 A | 10/1975 | Lichtblau | |
| 4,091,125 A | 5/1978 | Delgadillo | |
| 4,215,342 A | 7/1980 | Horowitz | |
| 4,260,990 A | 4/1981 | Lichtblau | |
| 4,302,846 A | 11/1981 | Stephen et al. | |
| 4,356,477 A | 10/1982 | Vandebult | |
| 4,369,557 A | 1/1983 | Vandebult | |
| 4,413,254 A | 11/1983 | Pinneo et al. | |
| 4,429,302 A | 1/1984 | Vandebult | |
| 4,498,076 A | 2/1985 | Lichtblau | |
| 4,560,445 A | 12/1985 | Hoover et al. | |
| 4,567,473 A | 1/1986 | Lichtblau | |
| 4,717,438 A | 1/1988 | Benge et al. | |
| 4,730,095 A | 3/1988 | Richter-Jorgensen | |
| 4,846,922 A | 7/1989 | Benge et al. | |
| 4,876,555 A | 10/1989 | Jorgensen | |
| 4,900,386 A | 2/1990 | Richter-Jorgensen | |
| 4,954,814 A | 9/1990 | Benge | |
| 5,062,916 A | 11/1991 | Aufderheide et al. | |
| 5,103,210 A | 4/1992 | Rode et al. | |
| 5,108,822 A | 4/1992 | Imaichi et al. | |

(Continued)

*Primary Examiner*—Thiem Phan
(74) *Attorney, Agent, or Firm*—Caesar, Rivise, Bernstein, Cohen & Pokotilow, Ltd.

(57) ABSTRACT

A process for forming a portion of a package or envelope bearing printed indicia, a label bearing printed indicia or a sheet bearing printed indicia includes providing a substrate which constitutes a portion of the package, label or sheet to a printing apparatus, and utilizing the printing apparatus or an adjunct to the printing apparatus to form at least one electrically conductive component of an EAS and/or RFID tag on the substrate substantially contemporaneously with the printing of the indicia on the substrate. The forming of the electrically conductive component on the substrate is accomplished slightly prior to the printing of the indicia on the substrate, slightly after the printing of the indicia on the substrate and at the same time as the printing of the indicia on the substrate.

11 Claims, 12 Drawing Sheets

U.S. PATENT DOCUMENTS

| | | |
|---|---|---|
| 5,119,070 A | 6/1992 | Matsumoto et al. |
| 5,142,270 A | 8/1992 | Appalucci et al. |
| 5,201,988 A | 4/1993 | Matsumoto et al. |
| 5,218,189 A | 6/1993 | Hutchison |
| 5,241,299 A | 8/1993 | Appalucci et al. |
| 5,280,286 A | 1/1994 | Williamson |
| 5,300,922 A | 4/1994 | Stoffer |
| 5,376,943 A | 12/1994 | Blunden et al. |
| 5,382,784 A | 1/1995 | Eberhardt |
| 5,442,334 A | 8/1995 | Gallo et al. |
| 5,447,779 A | 9/1995 | Imaichi et al. |
| 5,510,769 A | 4/1996 | Kajfez et al. |
| 5,510,770 A | 4/1996 | Rhoads |
| 5,589,251 A | 12/1996 | Imaichi et al. |
| 5,614,278 A | 3/1997 | Chamberlain et al. |
| 5,645,932 A | 7/1997 | Uchibori |
| 5,660,663 A | 8/1997 | Chamberlain et al. |
| 5,682,814 A | 11/1997 | Imaichi et al. |
| 5,695,860 A | 12/1997 | Imaichi et al. |
| 5,708,419 A | 1/1998 | Isaacson et al. |
| 5,719,586 A | 2/1998 | Tuttle |
| 5,751,256 A | 5/1998 | McDonough et al. |
| 5,781,110 A | 7/1998 | Habeger, Jr. et al. |
| 5,800,724 A * | 9/1998 | Habeger et al. ............... 216/35 |
| 5,825,290 A | 10/1998 | Lian et al. |
| 5,841,350 A | 11/1998 | Appalucci et al. |
| 5,861,809 A | 1/1999 | Eckstein et al. |
| 5,864,301 A | 1/1999 | Jackson |
| 5,867,102 A * | 2/1999 | Souder et al. ............ 340/572.8 |
| 5,877,728 A | 3/1999 | Wu et al. |
| 5,902,437 A | 5/1999 | McDonough et al. |
| 5,920,290 A | 7/1999 | McDonough et al. |
| 5,926,093 A | 7/1999 | Bowers et al. |
| 5,959,531 A | 9/1999 | Gallagher, III et al. |
| 5,973,598 A | 10/1999 | Beigel |
| 5,983,363 A | 11/1999 | Tuttle et al. |
| 6,025,780 A | 2/2000 | Bowers et al. |
| 6,031,458 A | 2/2000 | Jacobsen et al. |
| 6,034,604 A | 3/2000 | Kaltner |
| 6,072,383 A | 6/2000 | Gallagher et al. |
| 6,078,791 A | 6/2000 | Tuttle et al. |
| 6,087,940 A | 7/2000 | Caperna et al. |
| 6,089,453 A | 7/2000 | Kayser et al. |
| 6,107,920 A | 8/2000 | Eberhardt et al. |
| 6,147,662 A | 11/2000 | Grabau et al. |
| 6,166,706 A | 12/2000 | Gallagher, III et al. |
| 6,177,871 B1 | 1/2001 | Rasband |
| 6,195,006 B1 | 2/2001 | Bowers et al. |
| 6,208,235 B1 | 3/2001 | Trontelj |
| 6,214,444 B1 | 4/2001 | Uchibori |
| 6,218,942 B1 | 4/2001 | Vega et al. |
| 6,249,229 B1 | 6/2001 | Eckstein et al. |
| 6,259,408 B1 | 7/2001 | Brady et al. |
| 6,265,977 B1 | 7/2001 | Vega et al. |
| 6,271,756 B1 | 8/2001 | Davies, Jr. et al. |
| 6,285,342 B1 | 9/2001 | Brady et al. |
| 6,304,169 B1 | 10/2001 | Blama et al. |
| 6,310,963 B1 | 10/2001 | Erdol et al. |
| 6,375,780 B1 | 4/2002 | Tuttle et al. |
| 6,383,616 B1 | 5/2002 | Uchibori |
| 6,400,271 B1 | 6/2002 | Davies, Jr. et al. |
| 6,404,341 B1 | 6/2002 | Reid |
| 6,415,978 B1 | 7/2002 | McAllister |
| 6,458,465 B1 | 10/2002 | Uchibori |
| 6,507,279 B2 | 1/2003 | Loof |
| 6,597,744 B1 | 7/2003 | Bettine et al. |
| 6,618,939 B2 | 9/2003 | Uchibori et al. |
| 6,761,316 B2 | 7/2004 | Bridgelall et al. |
| 6,940,408 B2 | 9/2005 | Ferguson et al. |
| 2002/0017993 A1 | 2/2002 | Blama et al. |
| 2002/0025416 A1 | 2/2002 | Uchibori |
| 2003/0020613 A1 | 1/2003 | Cosnard |
| 2003/0051806 A1 | 3/2003 | Appalucci et al. |
| 2004/0025324 A1 | 2/2004 | Uchibori et al. |
| 2004/0174261 A1 | 9/2004 | Volpi et al. |
| 2004/0188531 A1 | 9/2004 | Gengel et al. |
| 2004/0189472 A1 | 9/2004 | Acosta et al. |
| 2005/0021172 A1 | 1/2005 | Winter et al. |
| 2005/0091821 A1 | 5/2005 | Best et al. |
| 2005/0198811 A1 | 9/2005 | Kurz et al. |
| 2005/0252605 A1 | 11/2005 | Green et al. |
| 2006/0187063 A1 | 8/2006 | Rietzler et al. |

* cited by examiner

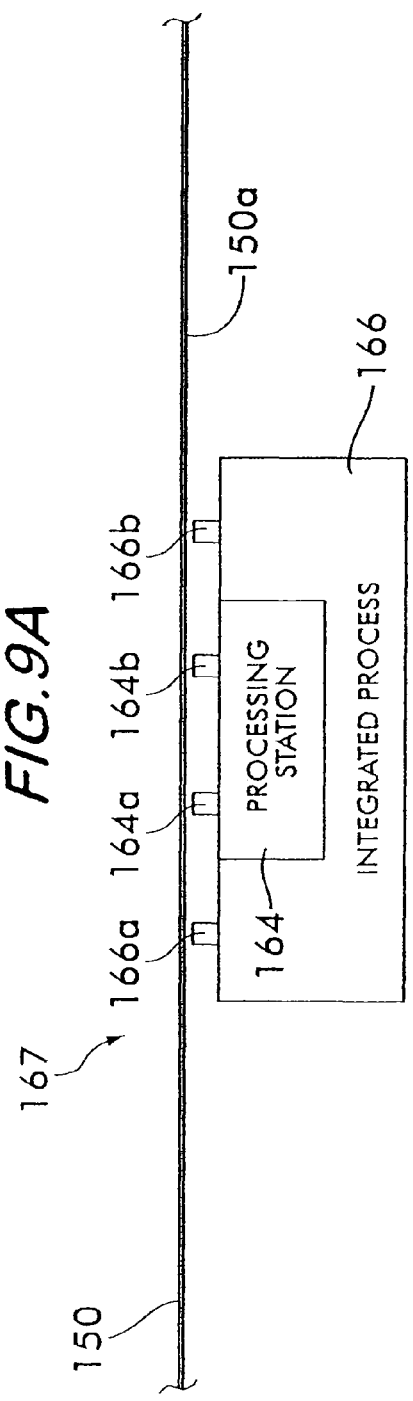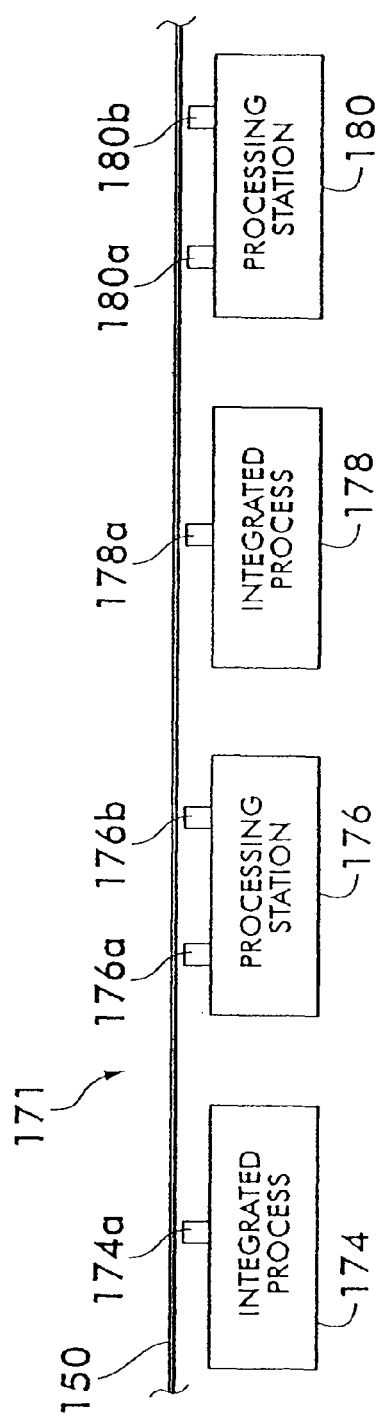

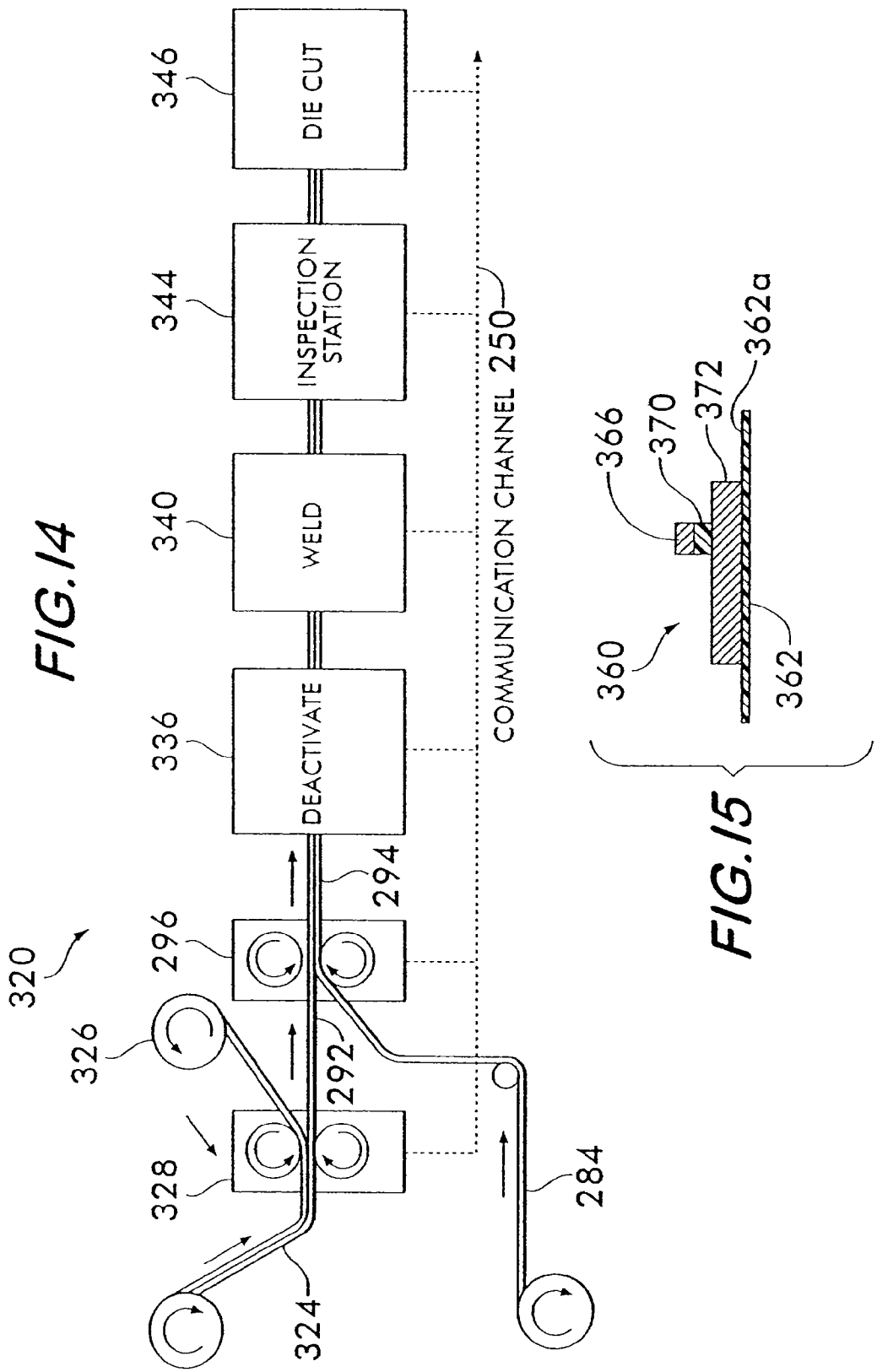

PROCESS FOR FORMING AT LEAST A PORTION OF A PACKAGE OR AN ENVELOPE BEARING A PRINTED INDICIA

RELATED APPLICATIONS

This is a continuation application based upon a utility application Ser. No. 10/996,786 filed on Nov. 24, 2004 entitled "SECURITY TAG AND SYSTEM FOR FABRICATING A TAG INCLUDING AN INTEGRATED SURFACE PROCESSING SYSTEM," which was based upon a provisional application Ser. No. 60/611,349, filed on Sep. 20, 2004 entitled "Security Tags, Apparatus and Methods for Producing Same," and wherein said application Ser. No. 10/99,786 is also based upon provisional application Ser. No. 60/547,235, filed on Feb. 23, 2004 entitled "Security Tags, Apparatus and Methods for Producing the Same". Applicant hereby claims for this continuation application the benefit of the filing dates of both provisional applications and of said utility application and all of whose entire disclosures are incorporated by reference herein.

BACKGROUND OF THE INVENTION

1. Field of Invention

The present invention relates to security tags and, more particularly, to a process for making an electrical circuit for use in a security tag.

2. Description of Related Art

Security tags are tags that are adapted to reflect electromagnetic energy in order to indicate their presence within a detection zone. They can be associated with an item in order to monitor the item. Two common types of security tags are resonant inductor/capacitor (LC) circuit based tags and dipole antenna based tags. Both of these types of tags respond to an electromagnetic scanning signal by providing a response signal. The response signal is detectable by suitable signal detection equipment for indicating the presence of a security tag within a scanned detection region or interrogation zone (sometimes referred to as an "interrogator"). In particular, the tag provides a response signal when stimulated by the electromagnetic field at a predetermined tag frequency. A disturbance of the electromagnetic field caused by the response signal is detectable by the signal detection equipment that is tuned to a predetermined detection frequency and is located in the detection region or zone. The signal detection equipment can be adapted to provide an alarm when an un-deactivated security tag is detected, such as commonly accomplished in Electronic Article Surveillance (EAS) applications.

Lc Security Tags

LC resonant tags commonly operate in the RF range. The LC circuits of such tags provide a response signal by resonating in response to the electromagnetic energy applied to them at their resonant frequency. In order to detect the presence of an LC based tag in a detection region or zone, the frequency of the electromagnetic energy applied to that region or zone is swept through a range of frequencies that includes the predetermined tag frequency. The LC circuit of the tag resonates when the swept frequency of the applied energy reaches the predetermined tag frequency. A security tag of this type is disclosed in U.S. Pat. No. 5,861,809, entitled "Deactivateable Resonant Circuit," issued on Jan. 19, 1999 to Eckstein, et al. (Eckstein).

Typically, the LC circuits of LC-based resonant tags are generally planar circuits formed of conductor layers and dielectric layers. One of the conductor layers includes one plate of a capacitor and a spiral conductor coil forming an inductor disposed upon a surface of a dielectric layer. One plate of the capacitor is connected to a proximal end of the coil. A second conductor layer is formed on the opposing surface of the substrate to serve as the second plate of the capacitor. The substrate thus serves as the dielectric of the capacitor. A through connection between the second plate and the distal end of the coil completes the fabrication of the inductor/capacitor (LC) resonant circuit. The two conductor layers can be formed using well known photo-etching techniques. Alternately, the conductor layers can be formed by laser cutting or arc cutting techniques as disclosed in U.S. Pat. No. 5,920,290, entitled "Resonant Tag Labels and Method of Making the Same," issued to McDonough on Jul. 6, 1999.

Other patents disclosing similar technology include U.S. Pat. Nos. 6,214,444, 6,383,616 and 6,458,465 assigned to Kabushiki Kaisha Miyake (Miyake) which teach a method for making resonant tags in which a circuit-like metallic foil pattern was adhered to a dielectric film prepared from a liquid resin by a coating process. A circuit-like metal foil pattern on one side of the dielectric film is aligned with a circuit-like pattern on the other side of the dielectric film so as to form a capacitor. The dielectric film had openings configured similarly to and aligned with openings in the circuit-like metal foil, wherein the configuration of the circuit-like metal foil pattern and the dielectric film was generally spiral in configuration.

U.S. Pat. No. 6,618,939 and Publication No. US 2004/0025324, also assigned to Miyake, teach a method for making resonant tags wherein a metal foil having a thermal adhesive applied to at least one face is stamped out into a circuit-like shape and adhered to a base sheet. The metal foil is stamped onto a metal foil portion having a predetermined shape while being passed through a die roll having a stamping blade with a predetermined shape. A transfer roll is in contact with the die roll to function as a die back-up roll and to hold the metal foil portion obtained by the stamping operation onto the surface of the transfer roll by suction holes formed in the transfer roll. The stamped out metal foil portion is thermally adhered to the base sheet in contact with the transfer roll by an adhesive roll in contact with the transfer foil through the base sheet.

Another patent assigned to Miyake, U.S. Pat. No. 5,645,932, teaches a method for making resonant tags in which a laminate was fabricated by adhering a metal foil coated with hot-melt adhesive resin film to a carrier sheet such as paper. The metal foil of the laminate was stamped out using a stamping die to provide a predetermined circuit-like pattern. The metallic foil side of the laminate was superposed on a support such as a plastic film. The circuit-like metallic foil was then transferred to the surface of the support by heating the circuit-like pattern from the support side of the carrier sheet side.

U.S. Pat. No. 4,730,095 (the '095 patent), assigned to Durgo AG, teaches a method of producing a plurality of equal printed circuits on a common, planar insulating carrier having an electrically conducting layer on at least one of its surfaces. The electrical circuits have a spirally arranged conductor trace forming at least one induction coil and at least one capacitor.

In the '095 Patent, a plurality of reference perforations are applied to the insulating carrier using a laser and a conducting layer is applied to at least one side of the carrier. A portion of the conductive layer having the rough contours of a circuit element is removed. The circuit element can be an inductive coil and the remaining portion of the conductive layer can have a shape and size approximating the outside dimensions of the coil. Computer controlled lasers are then used to remove further portions of the conductive layer to provide conductive tracks which form the electrical circuit. The electrical values of the circuit are determined and compared with design values. The electrical values can be corrected using the lasers if necessary.

U.S. Pat. No. 4,900,386, also assigned to Durgo AG, teaches a method for producing labels incorporating electrical oscillating circuits wherein parts of the circuits are initially punched out of a center area of a metal web covered by an adhesive. The center area is then covered by an insulating material web for handling stability in order to punch out the part of the circuit to be located at the outer web area. A covering foil is laminated onto the metal web and the parts of the Cortez to be located on the reverse side are applied onto the insulating material web and connected electrical to the remainder of the circuit.

This method of fabricating the elements of an LC-based tag has several problems. One particularly significant problem is the cost of the substrate itself and the design limitations placed on the tag by various substrate requirements. Since the substrate is a structural element that must provide most of the structural integrity of the tag, there are minimum requirements on the mechanical strength of the materials that can be used to form the substrate. This limits the number of different kinds of materials that can be used to form substrates. U.S. Pat. No. 5,142,270, entitled "Stabilized Resonant Tag Circuit and Deactivator," issued to Appalucci et al. on Aug. 25, 1992, discloses selected considerations with respect to substrate strength.

Additionally, the requirement that the substrate provide sufficient mechanical strength to the response circuit imposes a requirement that the substrate be formed with a minimum thickness. This limits the amount of capacitance that can be provided on a unit area of substrate surface. U.S. Pat. No. 5,682,814, entitled "Apparatus for Manufacturing Resonant Tag," issued to Imaichi, et al. on Nov. 4, 1997, discloses the relationship between dielectric thickness and capacitance. The material of the substrate must also be capable of withstanding the photo-etch baths required to form the elements of the LC circuit. This factor places additional limitations on the materials that can be used in the design of substrates.

Under these circumstances, it may not be possible to optimize the dielectric properties of the substrate when selecting a dielectric material or a dielectric thickness for use as a component of a security tag. The inability to optimize the dielectric properties of the dielectric materials results in many problems, such as increased capacitor size, lowertag yields and hence, increased costs for the fabrication of security tags.

Other problems encountered in forming the elements of an LC-based tag arise from the photo-etching process. For example, the photo-etching process can be slow and quite expensive. An example of a system attempting to obtain high speed printing of security tags using a photo-etch process is U.S. Pat. No. 3,913,219, entitled "Planar Circuit Fabrication Process," issued to Lichtblau on Oct. 25, 1975. Fine tuning of the capacitance within an LC-based tag, by adjusting the amount of conductive material forming a capacitor plate after the initial fabrication step thereof, is disclosed in U.S. Pat. No. 4,369,557, entitled "Process for Fabricating Resonant Tag Circuit Construction," issued to Vandebult on Jan. 25, 1983.

In addition to the high cost of the photo-etching process itself, the fact that the process requires environmentally unsafe chemicals creates disposal problems for the spent materials. As will be appreciated by those skilled in the art, the procedures required to safely dispose of spent photo-etching materials significantly increase the costs of producing security tags. Furthermore, substantial amounts of conductive material must be removed by the etching process when forming the conductor layers of the tag. This further increases the costs of the fabrication process as a result of the waste of conductive material and/or the complications of performing various recovery processes, such as recovering aluminum, when forming the tags.

An additional area of difficulty encountered when using the prior art methods for forming security tags is accurate control of the amount of the capacitance in the tags. Inaccurate capacitance can result from variations in the dielectric constant, variations in the thickness of the dielectric material and variations in the alignment of the capacitor plates. The dielectric constant of the material can normally be specified and accurately provided for the materials used in the fabrication of tags. Additionally, the dielectric constant of a material can be tested prior to the fabrication process. Furthermore, the thickness of the dielectric material can normally be controlled by conventional coating technology and tested prior to the fabrication process.

Thus, the most common problem in accurately controlling the capacitance is the alignment of the circuit elements making up the tag. For example, when the second plate of the capacitor is disposed on the second surface of the substrate or over the first plate, much care must be taken to make certain that the second plate is correctly aligned with the first plate. Failure to align the plates correctly results in inaccuracies in the amount of capacitance produced since the actual area of overlap of the plates determines the capacitance. This causes inaccuracies in the frequency at which the tag resonates. Often this results in an upward shift in resonant frequency.

This problem can limit the speed of the fabrication process, increase the costs of the fabrication equipment and significantly lower the yield of the tag fabrication process, for example, by causing tolerance buildup quality control issues in the fabrication process. Furthermore, it is the nature of the capacitor structures formed during the tag fabrication process that small amounts of plate misalignment produce large variations in the capacitance produced and concomitant large variations in the resonant frequency of the resulting tags. This problem tends to be worse for stamped circuits than for etched circuits due to the nature of the substrate and dielectrics involved in the processes. Another problem is that when foil is die cut into a pattern the shearing action may create beveled geometry rather than a planar geometry near the edge of the cut. That is, the shearing action used to cut the foil may create sharp edges on the foil that may cut into the substrate thereby altering capacitance.

Dipole Security Tags

Dipole-based security tags are adapted for operation in the UHF range. The dipole making up such a security tag basically comprises one or more conductive strips, or stubs, that function as an antenna for receiving energy from an applied electromagnetic field. When the received field energy has a predetermined dipole frequency the antenna applies the energy to an associated system (e.g., circuitry) in the security tag to energize that circuitry. The circuitry energized in this manner can be an integrated circuit chip that is wire bonded to the conductive, dipole strips. U.S. Pat. No. 5,708,419, entitled "Method of Wire Bonding an Integrated Circuit to an Ultraflexible Substrate," issued to Isaacson et al. on Jan. 13, 1998, discloses the use of antenna to energize a system at a predetermined tag frequency that is primarily dependent on the antenna length.

When the circuitry within a dipole-based security tag is energized by way of the dipole antenna, the circuitry responds by providing a reflected signal. The reflected signal from the security tag is transmitted by the antenna thereby disturbing the applied field. Thus, a dipole-based security tag in a detection region can be detected by sweeping the frequency of the electromagnetic energy applied to the region through a range of frequencies that includes the predetermined dipole frequency. Suitable detection equipment detects the disturbance of the field when the frequency of the applied energy reaches the predetermined dipole frequency.

It is known to fabricate dipoles for security tags from copper and silver. For example, U.S. Pat. No. 6,375,780 entitled, "Method of Manufacturing an Enclosed Transceiver," issued to Tuttle on Apr. 23, 2002, teaches forming security tag dipoles from copper and silver ink. U.S. Pat. No. 5,280,286, entitled "Surveillance and Identification System Antennas," issued to Williamson on Jan. 18, 1994, teaches etching copper foil to form security tag dipoles. However, the use of copper and silver for security tag dipoles is very expensive.

Security tags can be used in many applications. In one of many examples, security tags can be attached to an item sold in a retail sales establishment to monitor the location of item and deter theft. In the retail establishment application, equipment, e.g., a transmitter, for applying an electromagnetic field to a detection region and detection equipment, e.g., a receiver, for detecting disturbances of the field caused by the presence of security tags can be located at or around points of exit from the establishment. Such transmitters and receivers can be combined into a single unit, sometimes referred to as an "interrogator." Additionally, detection equipment for security tags in retail establishments can be disposed in many other locations on the premises in order to monitor movement of the item within the establishment. Security tags are especially useful in cases where very large numbers of items must be monitored.

In another example, security tags can be attached to an inventoried item in a warehouse or an item being shipped from one location to another in commerce. The use of a security tag in this manner can be especially useful in providing inventory control for very large numbers of items. The use of security tags for inventory control is disclosed in U.S. Pat. No. 6,195,006, entitled "Inventory System Using Articles with RFID Tags," issued to Bowers et al. on Feb. 27, 2001. Furthermore, security tags can be attached to books, periodicals, audio tapes and like items located in libraries and other institutions that make such items available for access by the public.

Many methods for attaching a security tag to an item are known. One method is to clip a security tag to the material of the item to be monitored. The security tag can also be adhered to the material of the item to be monitored. Additionally, the tag can be clipped onto or adhered to materials associated with the item to be monitored, such as packaging, advertising or informational materials. However, all of the known methods for attaching a security tag to an item are costly and error-prone. The costs of these methods must be borne by the retailers and/or the providers of the goods or services. These costs are in addition to whatever costs are incurred in packaging, identifying or maintaining the items, and providing the required promotional or informational materials for the items.

Many LC security tags must be activated when they are ready for use. Furthermore, they must be deactivated when a sale of an item is consummated or when they are legitimately removed from an item. For example, an LC security tag which is not removed from an item or deactivated at a point of sale in one establishment may set off an alarm from detection equipment located at a second establishment. This can result in an innocent customer being questioned by personnel at the second establishment.

In general, LC security tags are activated and deactivated by shifting their resonant frequency into and out of the frequency range to which the detection equipment is tuned. The resonant frequency can be shifted for the purpose of activation and deactivation by changing the amount of capacitance in the resonant circuits of the tag. U.S. Pat. No. 6,025,780, entitled "RFID Tags Which Are Virtually Activated And/or Deactivated and Apparatus and Methods of Using Same in an Electronic Security System," issued to Bowers on Feb. 15, 2002 discloses such a system. Another system for shifting resonant frequencies in this manner is disclosed in U.S. Pat. No. 5,103,210, entitled "Activatable/Deactivatable Security Tag for Use with an Electronic Security System," issued to Rode on Apr. 7, 1992. Additionally, U.S. Pat. No. 4,876,555, issued to Durgo AG, teaches a method for carrying out deactivation using a continuous hole which can be formed by means of a needle roll and is disposed in the insulating layer of a resonant label in the region between two conducting layers.

One method for changing the amount of capacitance in a security tag involves creating a weakened area between the two plates of a capacitor during the tag fabrication process. The weakened area creates a higher electromagnetic field in its vicinity when electromagnetic energy is applied to the tag at the predetermined frequency. U.S. Pat. No. 5,861,809 (Eckstein) discloses another method for changing the frequency in a security tag. An inductor taught in this patent is formed with a discontinuity, or gap, causing an electrical open circuit. The open circuit is closed with a fuse which is secured near the gap and wire bonded to portions of the inductor near the gap. The fuse is melted by a current greater than a predetermined level flowing through it in order to deactivate the tag. A current level which is high enough to melt the fuse can be induced by an external electromagnetic field. Melting of the fuse causes an open circuit condition, which alters the resonant frequency of the tag.

In another example of changing capacitance to alter the resonant frequency of a security tag, one of the capacitor plates can be formed with a dimple protruding from its surface. The dimple provides a shorter distance between the tip of the dimple and the opposing plate, than between the remaining surfaces of the two plates. When a high level of electromagnetic energy is applied to the tag, a voltage in excess of the breakdown voltage can be created between the tip of the dimple and the opposing plate. This causes the dielectric material to break down, thereby substantially short circuiting the two plates to each other. When the capacitor shorts out in the weakened area, its capacitance goes substantially to zero and the resonant frequency of the tag is moved out of the range of frequencies being swept by the detection equipment. Such a dimple for deactivating a resonant tag is disclosed in U.S. Pat. No. 5,142,270, entitled "Stabilized Resonant Tag Circuit and Deactivator," issued to Appalucci et al. on Jul. 8, 1992.

One problem with the known methods for deactivating tags is that a tag may spontaneously reactivate at a later time. It is believed that one reason why tags reactivate may be that the short circuit between the plates of the capacitor is formed by fragile dendritic structures created by the breakdown of the dielectric. The structures providing the short circuit between the plates can therefore break at a later time, for example, due to flexing of the tag, and restore the high resistance path between the plates. When this occurs, a security tag that is deactivated after a legitimate purchase can set off an alarm if an innocent bearer of the tag inadvertently brings it into a detection region.

It is sometimes desirable to activate or deactivate a large number of security tags at the same time using bulk activation or bulk deactivation techniques. For example, a manufacturer of security tags can manufacture a large number of activated tags. If a container of the activated tags is sold to a retail establishment that is not using a corresponding detection system, they must be deactivated. In another example, an entire container of items having individual security tags can be legitimately purchased at the same time. It is not uncommon for such containers to have dimensions of four feet by eight feet. In each case, large numbers of tags at varying distances and orientations must be activated or deactivated at the same time. Thus, problems may occur when activation or deactivation energy is applied in these examples and tags may not be effectively processed.

Additional references pertinent to the field of security tags include: U.S. Pat. Nos. 4,215,342; 4,260,990; 4,356,477; 4,429,302; 4,498,076; 4,560,445; 4,567,473; 5,108,822; 5,119,070; 5,142,270; 5,142,292; 5,201,988; 5,218,189; 5,241,299; 5,300,922; 5,442,334; 5,447,779; 5,463,376; 5,510,770; 5,589,251; 5,660,663; 5,682,814; 5,695,860; 5,751,256; 5,841,350; 5,861,809; 5,864,301; 5,877,728; 5,902,437; 5,920,290; 5,926,093; 5,955,950; 5,959,531; 6,025,780; 6,031,458; 6,034,604; 6,072,383; 6,087,940; 6,089,453; 6,166,706; 6,208,235; 6,214,444; 6,304,169; 6,458,465; 6,618,939. All references cited herein are incorporated herein by reference in their entireties.

BRIEF SUMMARY OF THE INVENTION

A process for forming at least a portion of a package or envelope bearing printed indicia, a label bearing printed indicia or a sheet bearing printed indicia includes providing a substrate which constitutes a portion of the package, label or sheet to a printing apparatus, and utilizing the printing apparatus or an adjunct to the printing apparatus cooperatively located with respect to the printing apparatus to form at least one electrically conductive component of an EAS and/or RFID tag on the substrate substantially contemporaneously with the printing of the indicia on the substrate. The forming of the at least one electrically conductive component on the substrate is accomplished slightly prior to the printing of the indicia on the substrate and the forming of the at least one electrically conductive component on the substrate is accomplished slightly after the printing of the indicia on the substrate. The forming of the at least one electrically conductive component on the substrate is accomplished at the same time as the printing of the indicia on the substrate. The formation of the at least one electrically conductive component on the substrate is accomplished by applying an adhesive to the substrate in a pattern desired for the at least one electrically conductive component, applying an electrically conductive layer to the adhesive pattern to cause portions of the electrically conductive layer to be secured to the adhesive pattern, and removing those portions of the electrically conductive layer that are not secured to the adhesive pattern.

Die-cutting the electrically conductive layer about the periphery of the portions of the electrically conductive layer that are secured to the adhesive pattern prior to removing those portions of the electrically conductive layer that are not secured to the adhesive pattern is also recited. The at least one electrically conductive component of an EAS or RFID tag comprises a coil or a portion of a coil. The at least one electrically conductive component of an EAS or RFID tag comprises an antenna or a portion of an antenna. The at least one electrically conductive component of an EAS or RFID tag comprises a plate of a capacitor or a portion of a plate of a capacitor.

The invention includes a method of fabricating a tag for reflecting electromagnetic energy for the purpose of indicating the presence of the tag, the tag including a substrate having a surface, the method including the steps of applying a first patterned adhesive to the surface of the substrate and applying a first electrically conductive foil to the first patterned adhesive to adhere the first electrically conductive foil thereto. A portion of the first electrically conductive foil not adhered to the first patterned adhesive is removed and a second patterned adhesive is applied to a portion of a surface area of the tag, the surface area including the surface and the first electrically conductive trace. A preformed second electrically conductive foil is applied to the second patterned adhesive to adhere the second electrically conductive foil to the surface of the substrate and portions of the first and second electrically conductive foils are electrically coupled to each other to form a tag circuit. A second patterned adhesive is disposed between the first and second electrically conductive foils. One of the first and second electrically conductive foils can form a portion of an inductor and a plate of a capacitor, and the other of the first and second electrically conductive foils can form another plate of the capacitor. The tag circuit can be an antenna, including a dipole antenna or an integrated circuit.

The invention further includes a tag arranged to reflect electromagnetic energy for the purpose of indicating the presence of the tag, the tag having a substrate having a surface with a preformed first patterned adhesive disposed over the surface of the substrate and a first layer of electrically conductive material having a shape corresponding to a desired final pattern for a first electrically conductive trace secured to the surface of the substrate by the preformed first patterned adhesive, wherein the preformed first patterned adhesive corresponds to the desired final pattern. A second patterned adhesive is disposed over a portion of a surface area of the tag the surface area including the surface and the first electrically conductive trace. An electrically conductive trace is disposed over the second patterned adhesive to adhere the second electrically conductive trace thereto. An electrical connection is provided for electrically coupling portions of the first and second electrically conductive traces to form a tag circuit. At least one of the first and second electrically conductive traces can be an inductive element and one of the first and second electrically conductive traces can be a first plate of a capacitive element. The other of the first and second electrically conductive traces can be a second plate of the capacitive element. The tag circuit can be an LC resonant circuit. The preformed first patterned adhesive can be a flexographic printed layer.

The invention further includes a tag arranged to reflect electromagnetic energy for the purpose of indicating the presence of the tag, the tag having a substrate with a surface including a first patterned adhesive disposed over the surface of the substrate. The first patterned adhesive has a shape corresponding to a desired final pattern for a first electrically conductive trace. The first electrically conductive trace is disposed over the first patterned adhesive to adhere to the first electrically conductive trace thereto. A second patterned adhesive is disposed over a portion of a surface area of the tag the surface area including the surface and the first electrically conductive trace and a second electrically conductive trace is disposed over the second patterned adhesive to indirectly adhere the second electrically conductive trace to the first electrically conductive trace. An electrical connection is provided for electrically coupling portions of the first and second electrically conductive traces to form a tag circuit.

A method for processing a surface of an item and providing an association using a surface processing system includes the steps of receiving an item having a first identification marking on a surface of the item to provide a received item for providing a first identification signal in response to a first interrogation signal and applying a second identification marking to the surface of the item for providing a second identification signal in response to a second interrogation signal. The method also includes applying at least one of the first and second interrogation signals to the item to provide at least one of the first and second identification signals and first receiving the at least one of the first and second identification signals in response to the applying the at least one of the first and second interrogation signals. A determining of a first association is made in response to the first receiving.

The first interrogation signal can be applied to the received item. The first association with the received item is then determined according to the first receiving of the first identification signal from the received item. The second interrogation signal can also be applied to the received item. Second receiving of the second identification signal and determining a second association in accordance with the second receiving can be performed. If at least one of the first and second identification signals includes a signal representative of an item level identification number, then the first association is an association between the item level identification number and the item. If the other of the first and second identification signals represents an automatic identification number, then the first association is an association between an automatic identification number and a circuit element. An association between the automatic identification number and the item level identification number or an association between the automatic identification number and the item can also be determined.

The first association is stored in an association database and a further interrogation signal for interrogating at least one of the first and second identification markings is provided for providing a further identification signal. The further identification signal is received. An association is selected from the association database in accordance with the further identification signal to provide a selected association. The item is identified in response to the selected association from the association database.

In one embodiment, at least one of the first and second identification markings includes visually perceptible indicia, for example a bar code, or a circuit element, for example, a resonant circuit, a dipole or an integrated circuit. The bar code represents an item level identification number for identifying the item. When one of the first and second identification markings is a visually perceptible marking, the other of the first and second identification markings can be a circuit element, for example, an RFID circuit or an EAS circuit.

The first and second identification markings can be applied to the surface of the item substantially simultaneously using a surface processing device. The first and second identification markings can be applied using at least two differing surface processing devices disposed within the surface processing system. The surface processing device can be a printing device, for example, a flexographic printing device, for printing a bar code on the surface of the item. A further marking, for example, package information, can also be printed on the surface of the item using the printing device.

A circuit fabrication device integrated with the printing device within the surface processing system applies a circuit element using the circuit fabrication device to provide a fabricated circuit element. The fabricated circuit element is applied to the surface of the item. A further circuit element is fabricated using the circuit fabrication device to provide a further fabricated circuit element, and the further circuit element is applied to the surface of the item. At least one of the fabricated circuit element and the further fabricated circuit element can include an RFID circuit or an EAS circuit. A response of the circuit element is measured to provide a measured response signal. A circuit parameter of the circuit element is adjusted in accordance with the measured response signal. A capacitance can be adjusted in response to the measured response signal, for example, by adjusting the alignment of capacitor plates or by compressing a dielectric layer. An antenna can be adjusted in response to the measured response signal, for example, by adjusting the length of the antenna. The visually perceptible indicia are applied to the surface of the item substantially simultaneously with the fabricating of the circuit element. A patterned adhesive and a preformed circuit element are applied to the surface of the item using the circuit fabrication device.

A circuit element disposed on a substrate surface to reflect electromagnetic energy for the purpose of indicating the presence of the circuit element includes first and second capacitor plates disposed over the surface of the substrate in an aligned relationship with each other. The aligned relationship having manufacturing variations in the relative positioning of the first and second capacitor plates and a dielectric layer disposed between the first and second capacitor plates. At least one of the first and second capacitor plates is formed substantially smaller relative to the other of the first and second capacitor plates. The at least one of the first and second capacitor plates is disposed at a predetermined offset in at least one planar direction from an edge of the other of the first and second capacitor plates. The predetermined offset is selected in accordance with the manufacturing variations to prevent variations in the value of capacitance of the capacitor due to the manufacturing variations.

At least one capacitor plate of the first and second capacitor plates can be disposed over the other capacitor plate of the first and second capacitor plates. The other capacitor plate of the first and second capacitor plates can be disposed over the at least one capacitor plate of the first and second capacitor plates. The dielectric can be a substrate whereby the first and second capacitor plates are disposed on opposing sides of the substrate. In one embodiment, the at least one capacitor plate of the first and second capacitor plates is disposed at a predetermined offset from two edges of the other capacitor plate of the first and second capacitor plates in two orthogonal planar directions. The predetermined offset is selected to provide an alignment of the first and second capacitor plates wherein the entire surface area of the at least one capacitor plate of the first and second capacitor plates faces an opposing surface area of the other capacitor plate of the first and second capacitor plates regardless of the manufacturing variations.

BRIEF DESCRIPTION OF SEVERAL VIEWS OF THE DRAWINGS

The invention will be described in conjunction with the following drawings in which like reference numerals designate like elements and wherein:

FIGS. 9A and 9B are schematic representations of surface processing systems including a method of the present invention integrated with one or more further processes;

FIG. 14 shows a schematic representation of an alternate embodiment of a fabrication system and method for fabricating exemplary security tags in accordance with the system and method of the present invention; and FIG. 15 shows a capacitor for a security tag formed in accordance with the present invention.

DETAILED DESCRIPTION OF THE INVENTION

Figure 1:
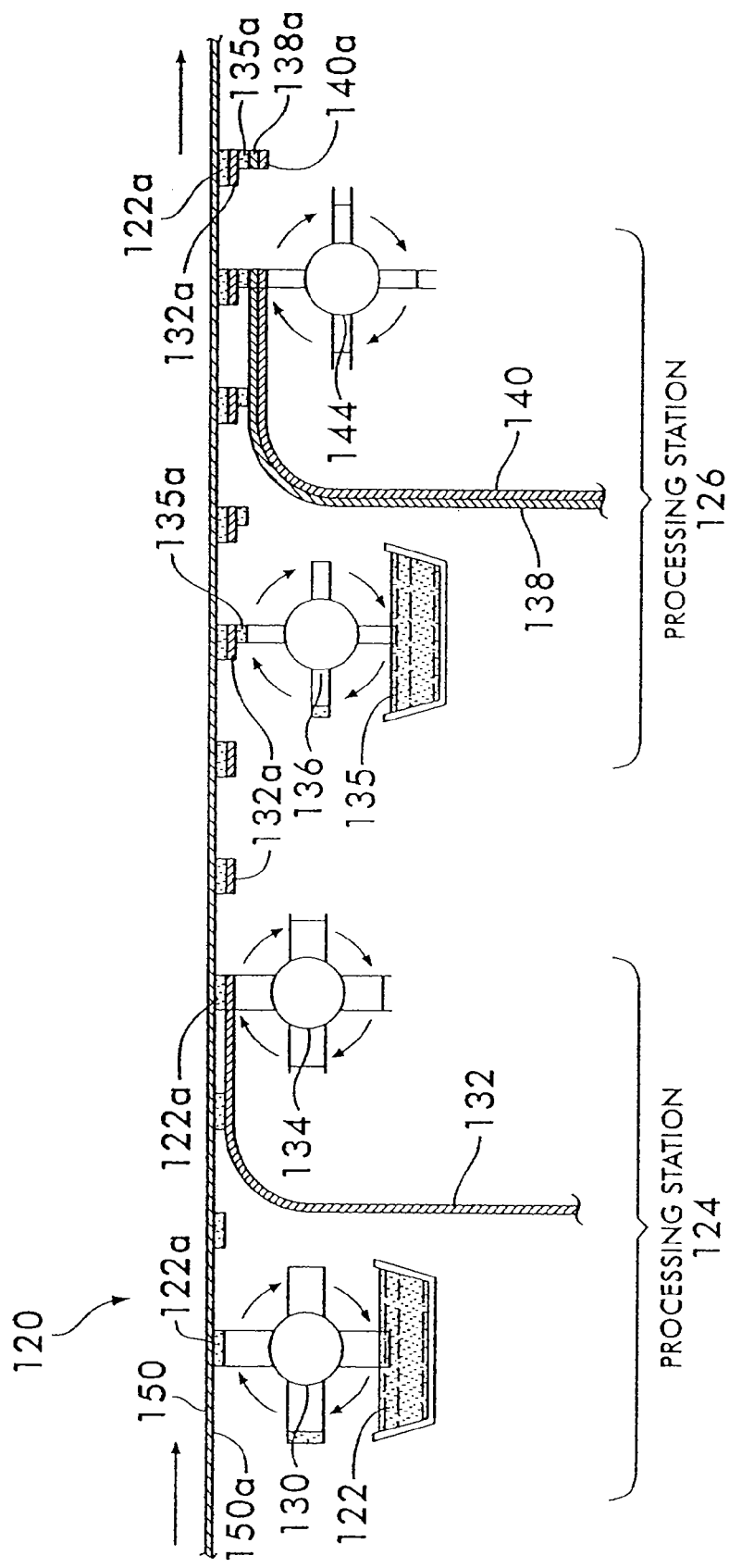
FIG. 1 is a schematic representation of a method for making exemplary security tags of the present invention.
Figure 2:
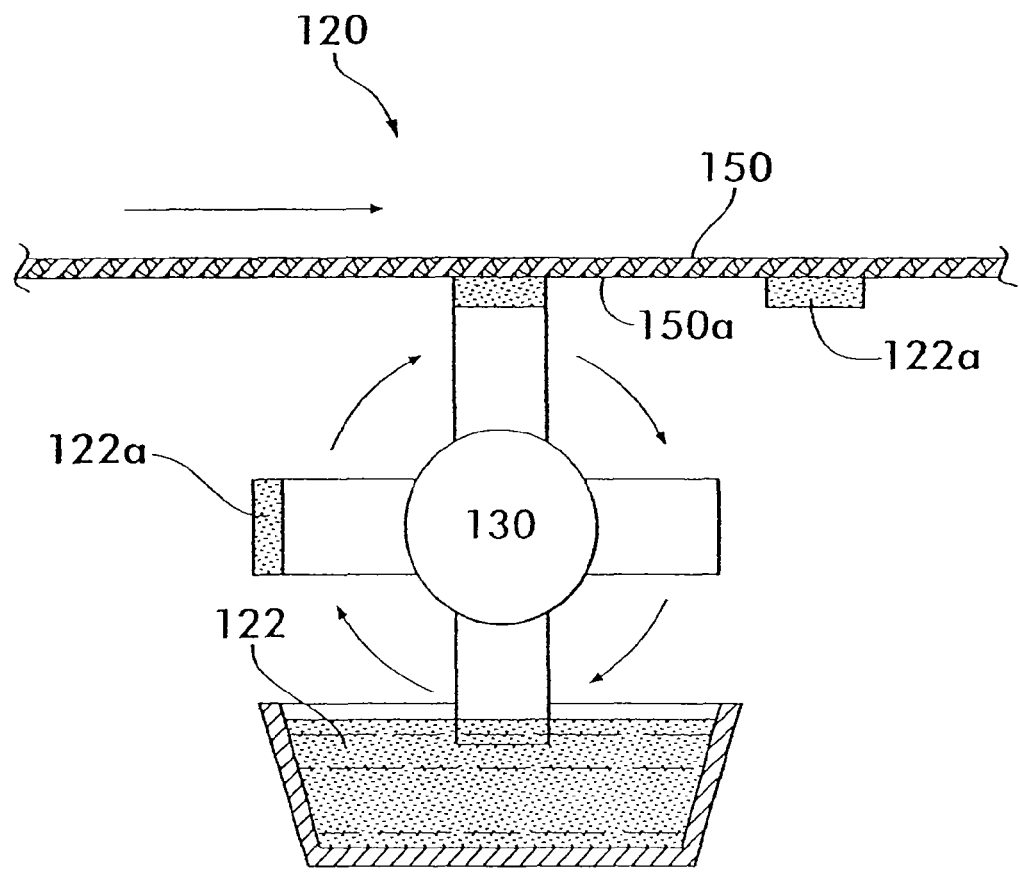
FIG. 2 is an enlarged view of a portion of the schematic representation of FIG. 1 showing a method for applying adhesive for adhering a conductive foil to a substrate in accordance with the present invention.

Referring now to FIG. 1, there is shown a schematic representation of a process 120 for fabricating a security tag according to one preferred embodiment of the invention. The process can be used for producing a security tag having a dipole and a security tag having an inductor and a capacitor. In order to facilitate an understanding of the tag fabrication process 120, FIGS. 2-5 show enlarged representations of selected portions of the schematic representation of FIG. 1.

In the tag fabrication process 120, an adhesive material 122 is applied to a surface 150a of a substrate to form a first patterned adhesive layer 122a. The pattern of the adhesive corresponds to the pattern of the particular portion of the component of the tag, e.g., a portion of the coil of the inductor, a plate of the capacitor, a dipole antenna, etc. The first patterned adhesive layer 122a can be applied to the substrate 150 by an adhesive transfer device 130. The adhesive transfer device 130 can be any conventional adhesive transfer device for applying adhesive images to a surface known to those skilled in the art. For example, the adhesive transfer device 130 can be an adhesive transfer device within a flexographic printing device, a gravure printing device, a letter pressing device, a silk screen or tempo device and so forth. The adhesive transfer device can be detachably secured to the printing device or it can be fixed thereto.

The printing or pressing device can also print indicia on the surface 150a substantially simultaneously with the fabrication of a tag. The indicia can be visible or invisible to the human eye. It can be human readable indicia, machine readable indicia, or any other type of indicia. For example, the indicia can be visible text, and/or graphics, bar codes or a marking printed with an ink that is visible only in ultraviolet light, or some other frequency of light. The indicia can include, for example, a single marking, a plurality of markings, or a selected color. In this manner, a bar code or other indicia can be applied to a surface substantially simultaneously with the fabrication of a tag such as an RFID tag on an EAS tag or other circuits or circuit elements.

The substrate 150 can be any polymeric material (such as PET and PE) or a non-polymeric material that can provide the required structural integrity for the security tag to function. For example, the substrate 150 can be formed of a material such as a corrugated material, laminated material, coated metal, any type of plastic, including injection molded plastic and other types of molded plastics and any kind of ceramic material. The substrate 150 can also be a pressure sensitive label or a label formed of a fibrous material such as paper, cardboard or cloth.

The paper forming the substrate 150 can be dandified Kraft. Dandified Kraft is a mix of standard slurry normally used for making traditional bond, or offset paper. Traditional papers may be varied to include softer woods and to include cotton additives along with recycled. Corrugated materials, laminated materials, polymers like PET and PE Teflon etc. can also be included.

The paper is normally formed using a traditional slurry mix which passes through a small opening of the head box onto a wire mesh running at a speed that matches the gravity feed fluidic deposition onto the wire mesh. The wire mesh retains the pulp, and lets the water pass through. This mesh is of a great distance and therefore the slurry is formed into wet paper substance. It is then pulled from the mesh and sent through a number of drying systems until the paper reaches its nominal state of approximately 5% moisture content. The paper is then rolled up and later cut into sheets for use. A starch coating can be applied to the paper as it is dried. This process ensures that as the paper is used to write upon it will not act like a sponge. This is done to varying degrees and for certain applications. The paper also passes through several nip points, which helps serve the purpose of reaching a specified thickness. The speed of the equipment is varied to achieve changes in density, and even the fiber type, length, and direction of the fiber lay are varied to achieve different type papers.

For dandified Kraft the paper is formed as normal, however, harder woods may be used. The key, however, is the ability to super calendar the paper. This is done with a heated calendar stack. This is a stack of large rollers that the paper web is run in and out of making 180-degree turns until a stack of 20 rollers and turns are made. This creates a paper that is hard and dandified. This is normally done with a high level of starch applied to create a paper that will soak up a minimal amount of moisture. This paper is structurally stable and superior to normal papers in this respect. Also due to its density this paper can withstand higher puncture, sheer and tensile then other papers.

Paper, as it is used for security tags, i.e., making RF labels and RF antennas, is used predominantly as a carrier for the antenna. The need for a carrier is due to the fact that an antenna such as used for RFID solutions is very thin. The antenna will not retain its shape after it is formed due to the lack of the conductive material's integrity. The antenna is formed to provide for reception of radio waves; if the shape is not retained, the reception will not be maintained. The paper creates the ability to form the object and retain its shape. Dandified Kraft creates a better surface due to its stability.

Mechanical factors, such as whether a material is strong enough to prevent shearing during the tag fabrication process 120, are substantially the only limitations placed on the selection of the material forming the substrate 150, or its thickness. When a flexible material, like cloth, is used as a substrate in a security tag, it may be necessary to apply a backing to the material in order to provide the required structural integrity.

The substrate 150 of a security tag fabricated according to the tag fabrication process 120 can be a composite substrate having at least a peelable layer and a carrier layer. The security tag can be fabricated on the peelable layer of such a composite substrate 150. When the peelable layer bearing the security tag is peeled from the carrier layer, it can be associated with or secured to any item. For example, the peelable layer can be provided with an adhesive layer for adhesively securing it to a surface of an item. A resonant tag formed on a composite substrate including a removable carrier film is disclosed in U.S. Pat. No. 5,902,437, entitled "Method of Making Resonant Tag Labels," issued to McDonough, et. al. on May 11, 1999.

Figure 3:
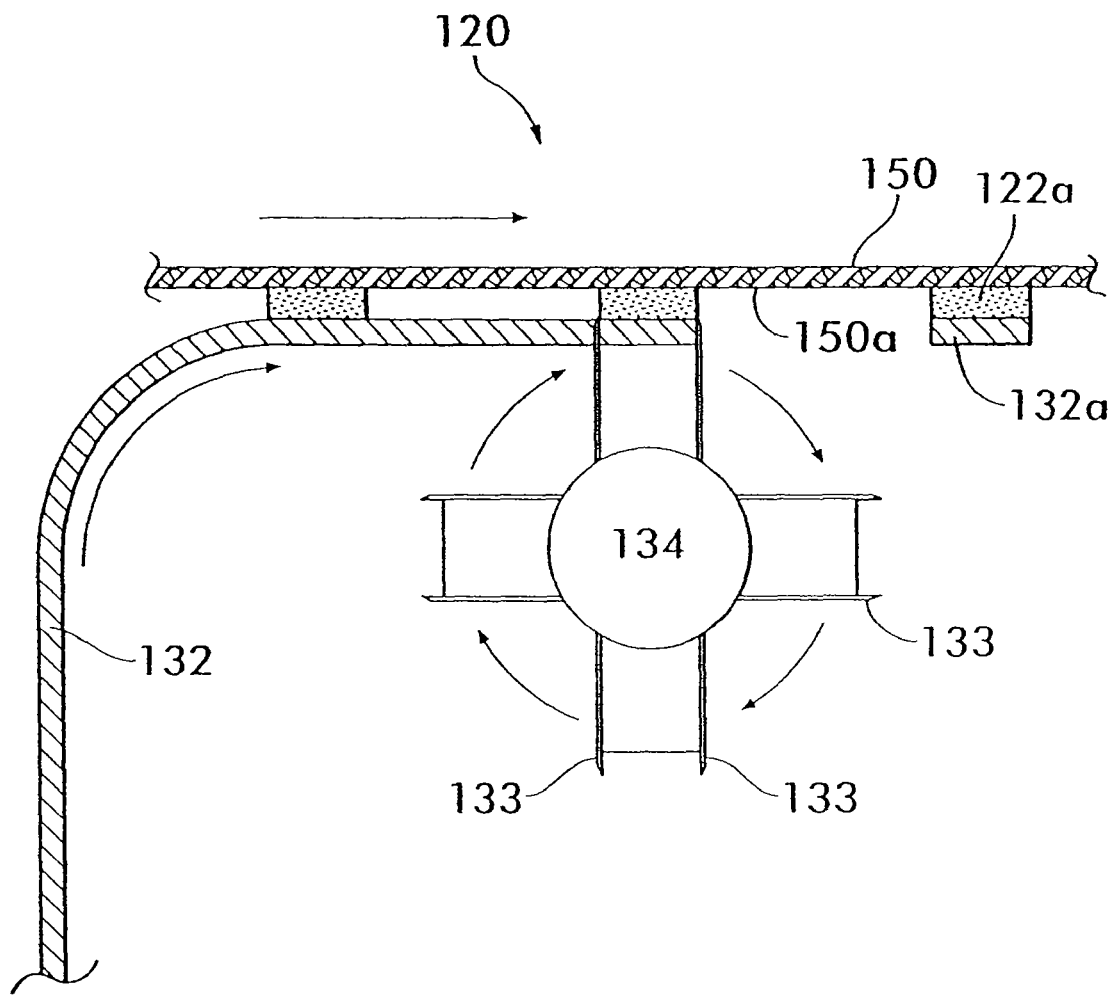
FIG. 3 is an enlarged view of a portion of the schematic representation of FIG. 1 showing a method for die cutting a conductive foil in accordance with the present invention.

In the tag fabrication process 120, a first conductive foil 132 is applied to the substrate surface 150a over the first patterned adhesive layer 122a, for example by an unwind roller (as seen most clearly in FIG. 3). The material forming the conductive foil 132 can be any conductive material. However, in one preferred embodiment, the conductive foil is aluminum. The conductive foil 132 adheres to the substrate surface 150a in the regions where the first patterned adhesive layer 122a is disposed by the adhesive transfer device 130.

A die cutter 134 cuts or "patterns" the adhered conductive foil 132 according to the pattern of the patterned adhesive layer 122a, e.g., along its peripheral edges. This action forms a first patterned conductive trace 132a in the tag fabrication process 120. A trace will be understood to include any piece of conductive foil, including for example, conductive foils that can be used as a conductor for conducting current to form all or part of an electronic circuit, a component or a whole of an antenna geometry, an electromagnetic coupling component for electronic circuitry, an electromagnetic passive director for an antenna geometry, an isolation element (a/k/a shielding) for electromagnetic purposes, a structural element for mechanical strength purposes, or a fiducial for post process operations. The blades 133 of the die cutter 130 are adapted to cut through the conductive foil 132 without damaging the surface 150a of the substrate 150. The die cutter 134 can be a conventional rotating die cutter 134 or any other device known to those skilled in the art for cutting a conductive foil without cutting or damaging the substrate 150. For example, the operations performed by the die cutter 134 can be performed by a laser. The unused portion of the conductive foil 132 which would otherwise constitute waste is recovered by the method of this invention, e.g., by any type of vacuum device or mechanical removal device known to those skilled in the art. Conductive material recovered for reuse in this manner can be recovered by a simple melting process. The amount of conductive material required to make a security tag using the tag fabrication process 120 can be sixty percent less than the amount typically required by conventional photo-etching techniques.

The adhesive transfer device 130 and the die cutter 134 cooperate to provide a processing station 124 of the tag fabrication process 120 for providing the first patterned conductive trace 132a. In one preferred embodiment of the invention, the first patterned conductive trace 132a can be shaped as a dipole. In this embodiment, an adhesive pattern or image of a dipole is disposed on the substrate surface 150 by the adhesive transfer device 130. An integrated circuit or other circuit required by the tag can be applied in a conventional manner.

An integrated circuit inserted in this manner can be any type of integrated circuit known to those skilled in the art, including driven circuits as well as passive circuits. The passive circuits can include a fuse for deactivation or for any other purpose, or a non-linear component, such as a diode for making the signature of a circuit more distinct.

The possible shapes of the dipole and the device for inserting the integrated circuit on the tag are discussed in more detail below. When providing a dipole using the processing station 124, the conductive foil 132 can be any conductive material, especially a metal such as aluminum or copper. In a preferred embodiment, aluminum is used because aluminum is sufficiently conductive and relatively inexpensive.

Figure 6A:
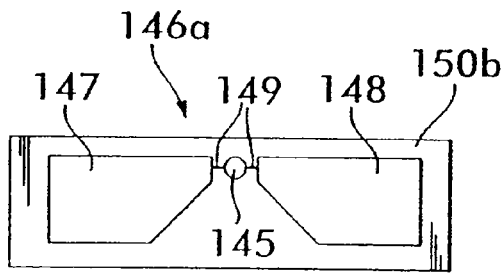
FIGS. 6A and 6B are plan views of generally rectangular dipole structures which can be fabricated in accordance with the present invention.
Figure 6B:
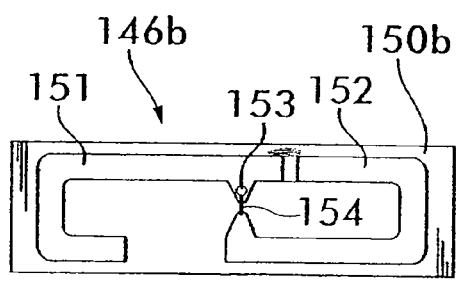
Figure 7A:
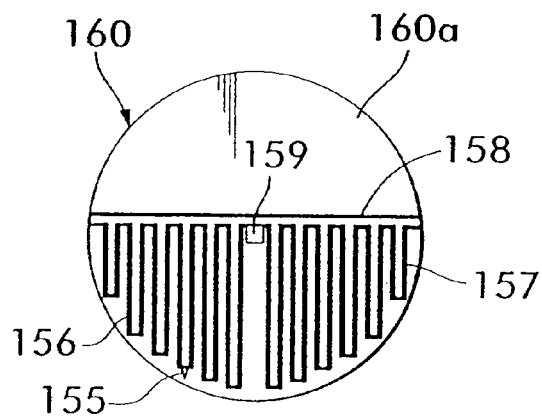
FIGS. 7A-7D are plan views of generally circular dipole structures which can be fabricated in accordance with the present invention.
Figure 7B:
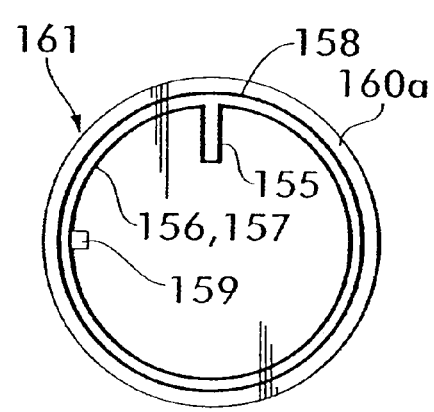
Figure 7C:
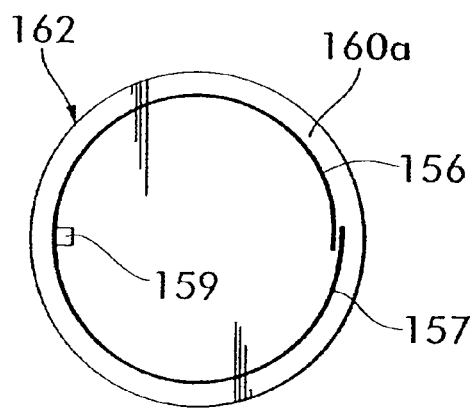
Figure 7D:
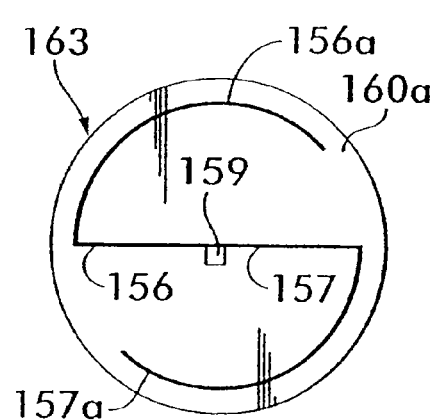

Referring now to FIGS. 6A and 6B, there are shown two exemplary dipoles 146a and 146b which can be fabricated in accordance with the tag fabrication method 120. The dipoles 146a and 146b are suitable for use in any location on any type of substrate 150, but are especially useful for use in areas of a substrate 150 where a rectangular configuration can make the best use of the available surface area of the substrate 150, such as the rectangular substrate regions 150b. The dipole 146a includes the dipole elements 147, 148 for receiving electromagnetic energy at a predetermined frequency and energizing an associated integrated circuit 145. The integrated circuit 145 or other electrical device for completing the tag can be disposed between the dipole elements 147, 148 and wire bonded to them using wires 149 in a conventional manner. The predetermined response frequency of the dipole 146a is primarily determined by the combined length of the dipole elements 147, 148, wherein the length of the dipole 146a on the substrate 150b can be approximately equal to the wavelength of the predetermined response frequency.

The dipole 146b includes the dipole elements 151, 152, which together form an S-shape. The effective antenna length of this type of dipole exceeds the longitudinal dimension of the dipole 146b because of the S-shape of the dipole elements 151, 152. Other shapes, such as Z-shapes can be used to make efficient use of the available area of the substrate. An integrated circuit 153 or other electrical device can be disposed upon one of the dipole elements 151, 152 and wire bonded to the other dipole element 151, 152 with a wire 154. The integrated circuit 153 can also be disposed between the dipole elements 151, 152 and wire bonded to them.

The shapes of the dipole elements making up either of the dipoles 146a and 146b as well as the shapes of any other dipole elements suitable for efficient use of the area of a rectangular substrate region 150b, can be easily implemented using suitable patterns for the adhesive transfer device 130 and the die cutter 134 of the tag fabrication process 120. Furthermore, the dipole elements making up each of the dipoles 146a and 146b can be easily implemented using the tag fabrication process 120 in any length required to provide the resonant frequencies that are useful in the field of security tag fabrication.

Referring now to FIGS. 7A-7D, there are shown dipoles 160-163 which can also be fabricated in accordance with the tag fabrication method 120 of this invention. The dipoles 160-163 are especially useful in areas of substrate 150 where a circular configuration makes the best use of the available surface area of the substrate 150, such as the circular substrate regions 160a. Each of the dipoles 160-163 includes a respective pair of dipole elements 156, 157 for receiving electromagnetic energy at a predetermined frequency and energizing an associated integrated circuit 159 or other electrical device required by the tag. The integrated circuit 159 can be disposed between the dipole elements 156, 157 and wire bonded (not shown) to them in a conventional manner. The dipoles 160, 161 can also include a tuning stub for tuning their predetermined response frequencies and/or a holding bar 158 for use in impedance matching. The dipole elements 156, 157 of the dipole 163 are provided with respective antenna extensions 156a, 157a to provide increased antenna length within the circular area available in the circular substrate region 160a.

All of the shapes of the dipole elements 156, 157 forming the dipoles 160-163, as well as the shapes of any other dipoles suitable for a circular substrate 160a, or any other dipole substrate geometry, can be easily implemented by the tag fabrication process 120. Their implementation requires only the suitable patterns for the adhesive transfer device 130 and the die cutter 134. Any additional features of dipole security tags, such as the tuning stub 155, the holding bar 158, the extensions 156a, 157a or a fuse (not shown) can also be easily implemented using the tag fabrication process 120.

In addition to shapes such as the S- and Z-shapes, the stub or strip, the meandering, the bent coil and the overlapping shapes shown herein for illustrative purposes, an almost unlimited number of additional dipole conductor shapes can be easily implemented using the tag fabrication process 120. For example, slot dipoles and matrix double dipoles having four circularly spaced-apart dipole elements can be easily made using the process 120. Furthermore, the conductortrace shapes that can be fabricated using the tag fabrication process 120 are limited only by the technology available for producing the adhesive images or patterns corresponding to the shapes and for die cutting the conductive traces according to those adhesive images or patterns.

Figure 4:
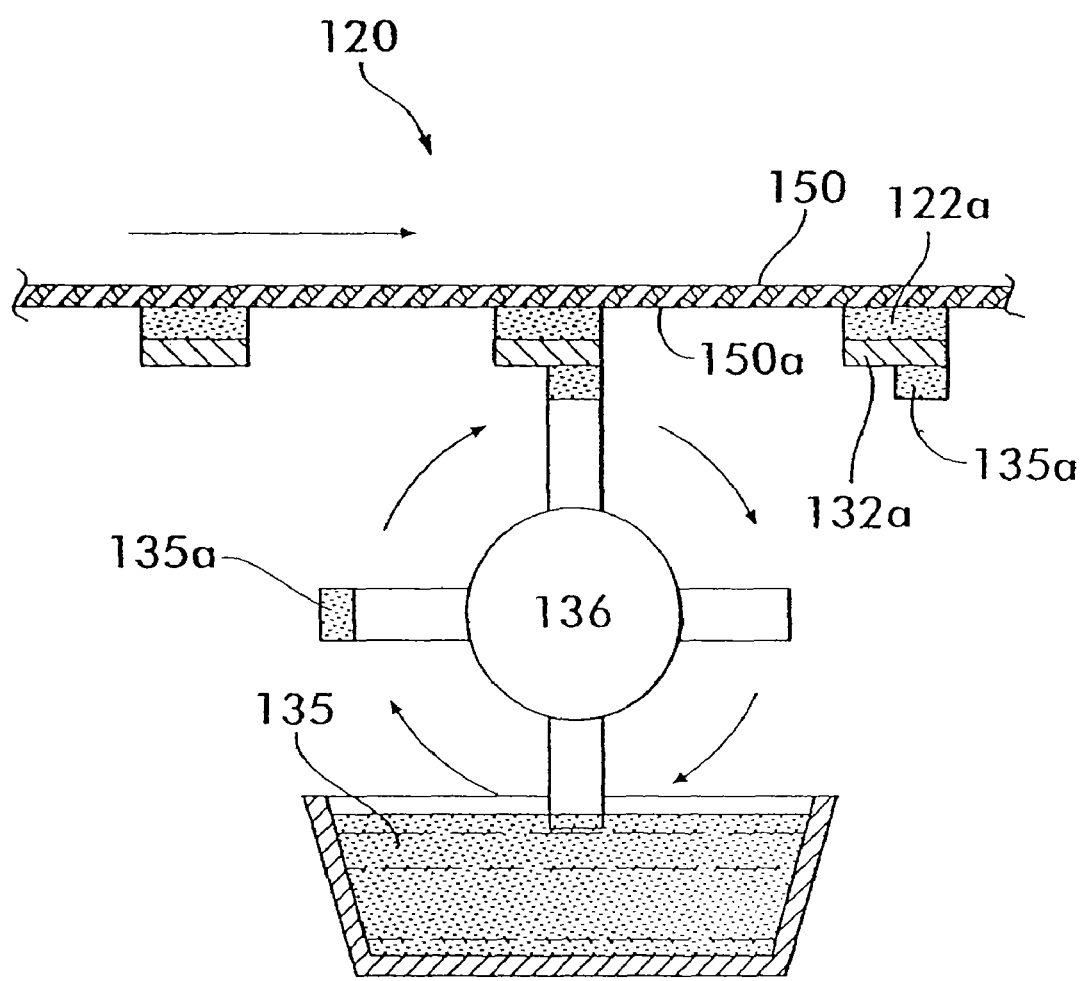
FIG. 4 is an enlarged view of a portion of the schematic representation of FIG. 1 showing a method for applying adhesive for adhering a dielectric and conductive foil to a substrate in accordance with the present invention.
Figure 5:
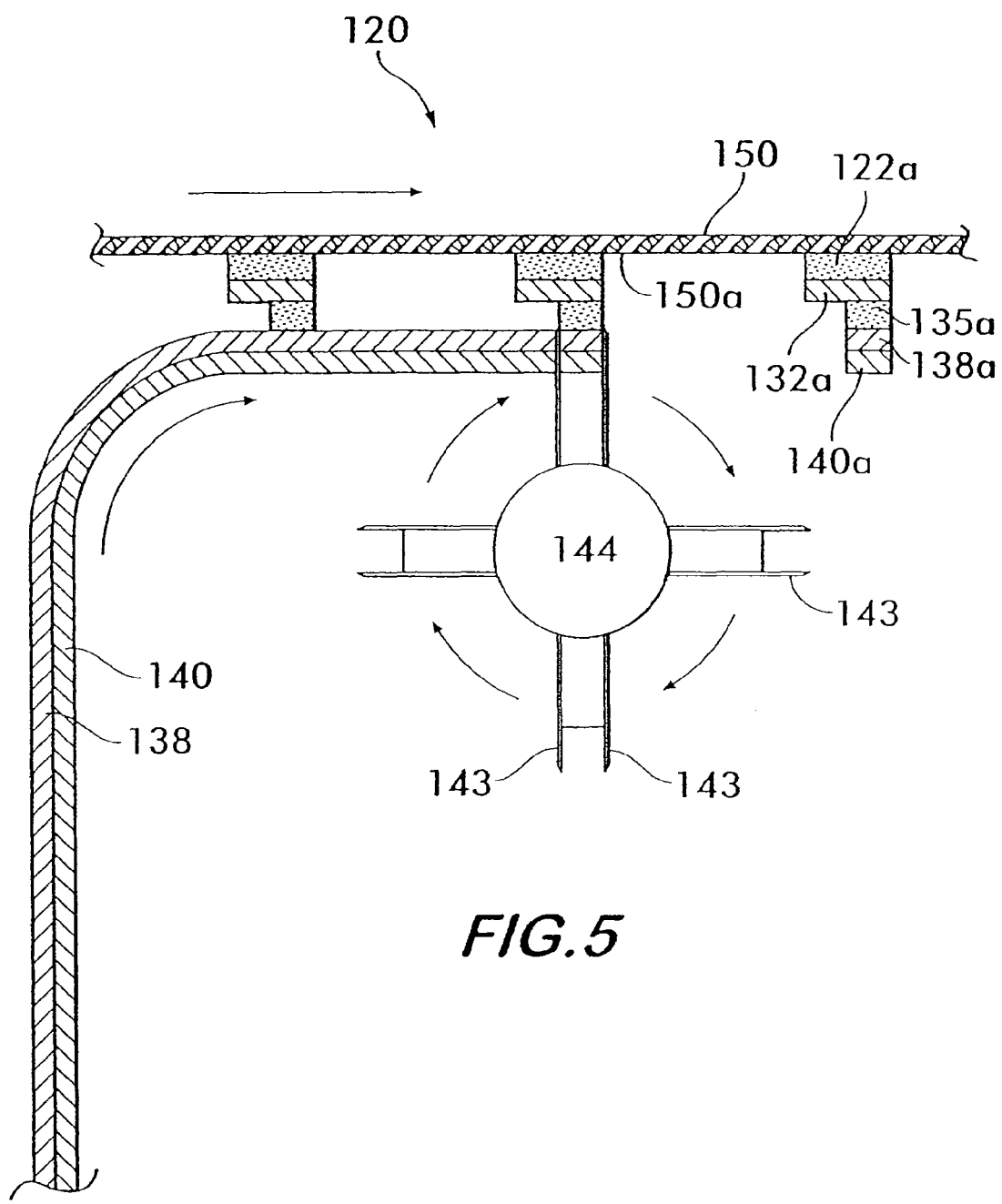
FIG. 5 is an enlarged view of a portion of the schematic representation of FIG. 1 showing a method for die cutting a dielectric and a conductive foil in accordance with the present invention.

Further, in accordance with the tag fabrication process 120, a second processing station 126 can be provided as can be seen in FIGS. 1, 4 and 5. While the operations of the processing station 126 are described herein in combination with selected processing stations for illustrative purposes, it will be understood that the processing station 126 can be used with any, or no, other processing stations. Within the second processing station 126, a second patterned adhesive layer 135a can be applied by a second adhesive transfer device 136. The second adhesive transfer device 136 can be any type of adhesive transfer device known to those skilled in the art, as previously described with respect to the adhesive transfer device 130.

The adhesive transfer device 136 can deposit an adhesive material 135 on selected portions of the surface 150a of the substrate 150 or on a surface of the first conductive trace 132a to form a second patterned adhesive layer 135a. In an alternate embodiment, the second adhesive layer 135a can be disposed on both the substrate 150a and the first conductive trace 132a. In another embodiment, the adhesive 135a can be disposed on any other suitable surface or surfaces over the substrate 150 in addition to the substrate surface 150a itself or the first conductive trace 132a. The second patterned adhesive layer 135a can also be disposed on the side of the substrate 150 opposite the first patterned adhesive layer 122a.

As seen most clearly in FIG. 5, a second conductive foil 140 is applied to the surface of the substrate 150 and/or on the surface of the first conductive trace 132a (hereinafter, the "surface area of the tag"), for example, from an unwind roll (not shown). The material forming the second conductive foil 140 can be any conductive material, especially a metal such as aluminum or copper. In a preferred embodiment, aluminum is used because it is sufficiently conductive and relatively inexpensive. The second conductive foil 140 is provided with a dielectric layer 138. The dielectric layer 138 can be a flood coated dielectric layer formed on a surface of the second conductive foil 140, a separate sheet of dielectric material applied to the second conductive foil 140 before or during the tag fabrication process 120 or any other type of dielectric layer.

When the dielectric layer 138 and the conductive foil 140 are applied to the substrate surface 150a and/or the surface of the first conductive trace 132a, the dielectric layer 138 adheres to portions of the surface area 132a according to a pattern of the second patterned adhesive layer 135a. The dielectric layer 138 and the conductive foil 140 are then patterned by a die cutter 144 using the die cutter blades 143, which pattern them according to the pattern of the second patterned adhesive 135a. The unused portions of the dielectric layer 138 and the conductive foil 140 are removed, for example, by a vacuum device for recovery, as described earlier. The removal of the unused portions can occur substantially simultaneously with and in-line with the patterning operations performed using the die cutter 144.

The second conductive trace 140a formed by the adhesive transfer device 136 and the die cutter 144 can be the same shape as the first conductive trace 132a. It can be disposed on the substrate surface 150a, the conductive trace 132a, or both. Furthermore, one, both or neither of the conductive traces 132a, 140a, or any of the layers in the security tag can be disposed in direct physical contact with the substrate 150, or any other area where the patterned adhesive layer 135 is disposed. An electrical connection can be provided between the conductive traces 132a, 140a.

The adhesive transfer device 136 and the die cutter 144 cooperate to form the processing station 126 of the tag fabrication process 120. While the tag fabrication process 120 is described in detail in the embodiment having a single processing station 124 and the embodiment having two processing stations 124, 126, it will be understood that any number of processing stations 124, 126 can be provided in accordance with the method of the invention. Furthermore, in one preferred embodiment of the invention, the processing stations 124, 126 can be located on opposing surfaces of the substrate 150, and the structure fabricated by the tag fabrication process 120 can be built on the opposing surfaces of the substrate 150.

In an another embodiment of the tag fabrication process 120, the processing station 124 can provide a first patterned conductive trace 132a shaped as an inductive element, such as a concentric coil, and a plate of a capacitive element. In this embodiment, an adhesive image of the coil and the capacitor plate is disposed on the substrate surface 150a by the adhesive transfer device 130. The second patterned conductive trace 140a can be a second plate of the capacitive element, wherein an adhesive image of the second plate is disposed on the first patterned conductive trace 132a or any other suitable surface area by the adhesive transfer device 136.

In this manner, a complete LC security tag can be formed on a single surface 150 of the substrate 150 by the tag fabrication process 120 without the use of any photo-resist or etching operations. The only materials required to fabricate the die cut structures produced by the tag fabrication process 20 are the substrate, the adhesive and the conductive foil. Alternately, both the first and second patterned conductive traces 132a, 140a can be formed as dipoles or any other devices which can be formed by patterning the conductive foils 132, 140. For example, the tag fabrication process 120 can be used to fabricate multiple frequency tags such as those disclosed in U.S. Pat. No. 5,510,769, entitled "Multiple Frequency Tag," issued to Kajfez, et al. on Apr. 23, 1996.

Additionally, the process 120 can be performed without waste of the adhesive or conductive foil. The only adhesive used in the process 120 is where the adhesive is actually required to form the conductor traces. Any conductor material cut away by the die cutters 134, 144 is easily recovered by a simple melting process.

In prior art security tags, the dielectric material disposed between the plates of a capacitor served as both the dielectric of the capacitor and the structural element upon which the tag was fabricated. Furthermore, the dielectric material was required to withstand the harsh environment of the photo-etch baths used in forming the conductortraces. These factors placed serious constraints on the selection of dielectric materials.

In security tags fabricated using the tag fabrication method 120, however, the dielectric layer 138 between the plates of the capacitor is not used as a structural element. Furthermore, the dielectric layer 138 is not required to withstand a photo-etching process. Therefore, the material forming the dielectric layer 138 can be selected primarily for the purpose of optimizing its dielectric properties, rather than for its mechanical strength or its resistance to etchants.

This permits, for example, the selection of materials having higher dielectric coefficients than the materials previously used as capacitor dielectrics in the fabrication of security tags. The use of materials having higher dielectric coefficients makes it possible to obtain a predetermined amount of capacitance within a smaller capacitor size. Smaller capacitor size permits the fabrication of smaller security tags for the same response frequencies. It also permits higher fabrication yields and lower tag costs.

Alternately, the use of higher dielectric coefficient materials makes it possible to obtain an increased amount of capacitance within a predetermined area of a substrate 150. Increased capacitance within an LC security tag permits the fabrication of a tag having a predetermined resonant frequency with less inductance. Fewer turns of the inductor coils are required when there is increased capacitance in the tag. The reduced number of turns in the inductor coils results in less unwanted coil resistance. Security tags formed in this manner thus have a higher quality factor Q, because of the reduced resistance in the coils. Additionally, it is understood that the magnetic effects of opposing turns in the coils result in unwanted self-cancellation of the currents in opposing turns of the coils. Therefore, coils formed using the tag fabrication process 120 and having fewer turns can have more efficient coupling to their antennas.

Those skilled in the art will understand that the tag fabrication process 120 can be used to provide a plurality of security tags in a continuous web of any size. For example, U.S. Pat. No. 5,614,278, entitled "Strip of Separable Labels or Tags Having a Display Surface for Display of Information Thereon," issued to Chamberlain et al. on Mar. 25, 1997, discloses tags supplied as a strip of consecutive separable units that moves along a path of travel. U.S. Pat. No 4,717,438, assigned to Monarch Marking Systems, Inc., discloses a method of making tags wherein conductors are cut from a planar web of conductive material in a continuous process. The cutting results in the formation of two spiral conductors which are thereafter positioned to provide resonant circuits.

When the tag fabrication process 120 is used to provide a plurality of security tags in this manner, the adhesive transfer devices 130, 136 are preferably rotatable devices, such as rotatable printing devices. Furthermore, those skilled in the art will understand that producers of security tags can decrease or eliminate the need to maintain inventory since the tag fabrication process 120 permits tags to be created as needed on demand.

Figure 8:
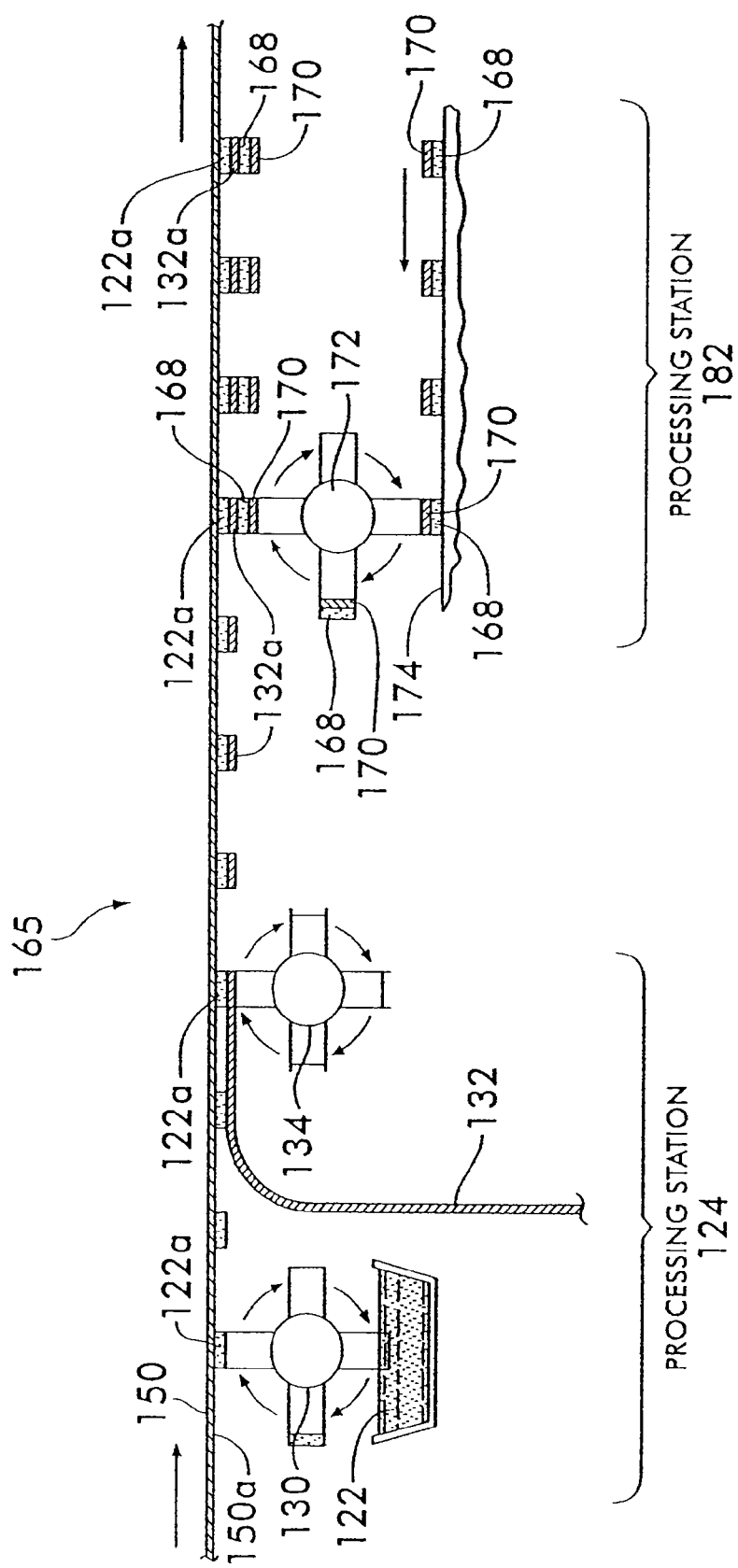
FIG. 8 is a schematic representation of alternate embodiment of the method for making exemplary security tags of FIG. 1.

Referring now to FIG. 8, there is shown the tag fabrication process 165. The tag fabrication process 165 is an alternate embodiment of the tag fabrication process 120. It will be understood that, as was shown in FIG. 1, when the die cutter 144 of the processing station 126 within the tag fabrication process 120 cuts through the conductive foil 140 and the dielectric layer 138, it is extremely important to avoid damaging the conductive trace 132a and the substrate 150. Failure to cut to the correct depth during die cutting can cause tags produced by the tag fabrication process 120 to be defective. Additionally, when force is applied during the die cutting operation the conductive trace 132a or the substrate 150 can be damaged by the force.

Therefore, as shown in FIG. 8, within the tag fabrication process 165, the processing station 182 can be substituted for the processing station 126. The processing station 182 can be used to form circuit elements which can be electrically coupled to the conductive trace 132a without performing any further die cutting operations over the surface 150a of the substrate 150, thereby removing the risk of damaging a tag during a die cutting operation.

In the processing station 182, a supply of precut conductive traces 170 is applied to the tag fabrication process 165 for registration with the conductive traces 132a using a carrier 174. In one preferred embodiment of the invention, the conductive traces 170 can be provided with a layer of adhesive dielectric 168 for adhering the conductive traces 170 to the substrate 150. In another embodiment, the adhesive dielectric 168 and the conductive trace 170 can be applied in separate steps.

The conductive traces 170 can be adhered in this manner to the conductive traces 132a, the substrate surface 150a, or any other surface on the substrate 150. This method can be used, for example, in forming a dielectric and a plate of a capacitor. Any other known method can be used to form a capacitor dielectric between the conductive traces 132a, 170. For example, a dielectric material that is not an adhesive can be laminated to the conductive traces 170. In such a case an adhesive layer can be provided between the dielectric material and the conductive trace 132a.

The conductive traces 170 can be transferred to the substrate 150 by any conventional technique known to those skilled in the art. For example, the well known rotary transfer device 172 can be used to transfer the conductive traces 170 from the carrier 174 to the substrate 150. In another example, well known windowing machines (not shown) of the type used to apply transparent windows to mailing envelopes can be used. Regardless of what method is used to apply the conductive traces 170 to the substrate 150, care must be taken to achieve the correct registration of the conductive traces 132a, 170. As previously described, small amounts of conductor misalignment produce large variations in the capacitance and concomitant large variations in the resonant frequency of the resulting tags.

Referring now to FIGS. 9A and 9B, there are shown surface processing systems 167, 171 which effect the tag fabrication process 120 of the present invention. It will be understood that the tag fabrication process 120 can be integrated into surface processing systems 167, 171 or any other system for processing a surface of an item. In particular, the process 120 can be performed within, along with, or integrated into, any other type of process or processes in which printing of a surface, or any other processing or preparation of a surface, is performed. For example, within the surface processing system 167, a processing station 164, having an adhesive transfer station 164a and a die cutter 164b, can perform the tag fabrication process 120 upon the surface 150a while integrated with an integrated process 166 having integrated operations 166a and 166b.

When the integrated process 166 and the tag fabrication process 120 within the processing station 164 are integrated in this manner, it is possible to conventionally print, for example, identifying, promotional or instructional material upon a portion of the surface 150a using the processing stage 166a. Additionally, it is also possible to fabricate a security tag upon the surface 150a using the processing station 164 within the surface processing systems 167. It is then possible to print or perform some other operation upon a portion of the surface 150a using the processing stage 166b.

The integrated process 166 can include any number of differing operations, such as printing operations and lamination operations, as well as multiple occurrences of a single type of operation. In one embodiment, the processing station 164 can fabricate dipole elements such as the dipole elements 147, 148 of the dipole 146a, or dipole elements such as the dipole elements 151, 152 of the dipole 146b and the processing stage 166b can insert the integrated circuit 145, 153 and the wire 149, 151 to wire bond the integrated circuit 145, 153 to the respective dipole elements. Furthermore, the processing station 164 can include any number of adhesive transfer devices and die cutters.

When the integrated process 166 includes a number of differing stations, the individual operations of the tag fabrication process 120 can be performed at any stage within the integrated process 166. Additionally, the various operations of the tag fabrication process 120 and the integrated process 166 can be performed in any order required. Thus, the relative positions of the operations and the order of the operations set forth in the drawing are for illustrative purposes only and are not intended to limit the scope or the invention.

The ability to integrate a processing station 124, 126 performing the tag fabrication process 120 within other processes thus permits manufacturers to easily apply a security tag to items while the items are being manufactured, finished, packaged, shipped, and so forth. For example, a processing station 124, 126 can be inserted at a selected point in a manufacturing process where an item is undergoing a previously required printing or finishing step. In this manner, the item can be provided with a security tag at the selected point of the process, for a substantially insignificant cost beyond the cost of the manufacturing process itself, e.g., the incremental cost of including a tag with other printed material is very low.

The operations performed by the processing stages 166a and 166b of the integrated process 166 can also be any other operations such as screening, plating, laminating, coating, finishing or processing the surface 150a in any manner. A printing process integrated with the tag fabrication process 120 in this manner can include flexographic printing, gravure printing, printing by a letter pressing device, or any other type of process for applying patterned substances including adhesive substances to the surface of the substrate 150, as previously described.

The processing station 124 can also be integrated with an inspection station for performing a quality control process within a tag fabrication process such as the tag fabrication process 120. For example, such an integrated inspection station can perform a quality control process adapted to energize a tag at its predetermined frequency following the fabrication of the tag, measure the response signal of the tag to the applied energy, and determine whether the tag is working properly. The center frequency of the tag response signal, the quality figure Q of the tag response signal, the amplitude of the response waveform, or any other tag parameter or ratio of parameters can be measured in order to make such a determination. Thus, defective tags fabricated by the tag fabrication process integrated with the quality control process can be located by the quality control process. Additionally, tags that are working correctly and tags that are defective can be identified and counted separately. Inspection stations for performing quality control are discussed in further detail hereinbelow.

The ability to integrate a processing station 124, 126 with other types of processes also permits a manufacturer to apply plural security tags to an item being manufactured at a slight incremental cost. For example, in the surface processing system 171, after an operation 174a of an integrated process 174 is performed upon the surface 150a, the processing station 182 can apply a first security tag to the surface 150a using the adhesive transfer station 182a and the die cutter 176b. Subsequently, for example, after the substrate is further processed by a further operation 178a with an integrated process 178, the processing station 180 can apply a second security tag using the adhesive transfer station 180a and the die cutter 180b.

The first and second security tags applied to the substrate 150 need not be identical tags. For example, one security tag can be an LC-based security tag and the other can be a dipole-based security tag. Additionally, the tags can both be RF tags, or both be UHF tags, that respond to different frequencies in the same frequency band. A manufacturer of items using the tag fabrication process 120 also has the option to apply security tags to selected percentages of the items being manufactured by merely turning the processing stations 164, 176, 180 on or off as items are being processed by the various integrated processes. For example, the manufacturer can select a process in which all, fifty percent, none, or some intermediate percentage of items receive fabricated security tags.

Furthermore, the processing station 182 can be adapted to fabricate the dipole elements of a dipole on the substrate 150 and the integrated process 178 can be adapted to insert and bond the integrated circuits 145, 153, 159 into their respective dipole elements. In an alternate embodiment, the integrated process 178 can be adapted to measure a frequency of the dipole and adjust a capacitance, for example, by adjusting a tuning stub 155 or by adjusting the amount of capacitance or inductance in some other manner. The capacitance of a tag can be adjusted by adjusting plate area, by adjusting a dielectric thickness in selected areas of the dielectric, by scratching a dielectric surface, by applying a conductive ink or a solvent, by adjusting the registration of the plates, by squeezing capacitor plates together to compress the dielectric therebetween, or by any other means.

Additionally, the frequency of the tags can be adjusted by adjusting any other tag parameters or values in addition to capacitance. Feedback systems of this nature can be used to bring the response frequencies of the security tag fabricated towards the center of its nominal range and the number and magnitudes of the adjustments can determined and recorded. Such a quality control method can be applied to any device within the tag fabrication process 120.

In one preferred embodiment of the invention, the processing system 171 can provide an item level association between: 1) an item level identification number disposed on an item or an object such as a package or label having a substrate 150 with a surface 150a, and 2) an automatic identification number, or license tag, stored on a device such as, for example, an RFID or EAS tag. In such an item level association system 171, the integrated process 174 can print an optical marking such as a bar code or any other visually perceptible indicia representative of the item identification number on the surface 150a. The marking can be human readable or machine readable. The marking applied by the integrated process 174 can thus encode the item level identification number of the item being processed by the association system 171 in any manner.

The integrated process 174 can print the marking representing the item level identification number on the surface 150a with or without applying other indicia to the surface 150a. Other indicia that can be applied to the surface 150a by the integrated process 174 or by some other integrated process along with the marking can include package information or designs and labeling information.

Within the item level association system 171, the processing station 176 fabricates or applies a marking comprising a circuit element such as a tag circuit on the surface 150a. The circuit element applied by the processing station 176 can be applied at any location on the surface 150a relative to the marking applied by the integrated process 174. Furthermore, the circuit element can be fabricated or applied in the manner previously described, or in any other manner known to those skilled in the art.

A circuit element applied in this manner can be, for example, a coil, a capacitor, a dipole or an integrated circuit element. Furthermore, the circuit element can include a license plate identification number for automatic identification of the circuit when the circuit element is interrogated. In further alternate embodiments of the invention, the marking that includes the item level identification number and the marking that includes the automatic identification number can be applied in the opposite order, or in combination with other surface processing operations in any order.

Thus, in one preferred embodiment, both of the markings are disposed on the surface 150a before the markings are applied to the integrated process 178 within the item level association system 171. In this embodiment, the integrated process 178 is advantageously adapted to be an association system 178. The association system 178 can include a system for reading the marking applied by the integrated process 174 in order to determine the item level identification of the item. For example, the association system 178 can include a bar code reader for interrogating a bar code marking applied to the surface 150a by the integrated process 174 and provide a signal representative of the item level identification number encoded by the bar code marking.

A circuit element interrogation device can also be provided within the association system 178 for interrogating the circuit element applied to the surface 150a by the processing station 176. The circuit element interrogation device within the association system 178 can thus interrogate the tag on the surface 150a to determine its automatic identification number. The item level identification number and the automatic identification number can be associated with each other and with the item upon which they are disposed by the association system 171. The associated information can be stored in a database and accessed in response to a later interrogation of one of the markings to determine the identity of the item.

It will be understood that the method set forth for the item level association system 171 can be extended to operate upon different markings disposed on different items in order to determine relationships between the various markings and items. For example, a first association can be determined between an item level identification number and an automatic identification number disposed on a first item, as previously described. A second association can be determined between the item level identification number and an automatic identification number on a second item. Thus, the first and second items can be associated with each other by the item level association system 171.

Additionally, the markings disposed on either of the first and second items can be representative of either an item level identification number or an automatic identification number. The different items bearing the various markings can be processed serially, in parallel or in any other manner. Furthermore, in another alternate embodiment one or more markings can be applied to the surface 150a before the substrate 150 is received by the item level association system 171 and one or more markings can be applied to the surface 150a within the item level association system 171. It will be understood that some identifying information for an item, (i.e. either its item level identification number or its automatic identification number), may already be known in the case where a marking is disposed on the surface 150a prior to the time that the surface 150a is received by the identification system 171. In this case it may only be necessary to perform one interrogation in order to determine the required association.

Additionally, a plurality of markings representative of item level identification numbers can be disposed on a surface 150 by a process such as the integrated process 174 within the item level association system 171. Furthermore, a plurality of markings having automatic identification numbers, such as those applied by the processing station 176, can be applied to a surface 150a within the item level association system 171. Any of the markings applied in this manner can be associated with each other and with an item or items by the item level association system 171.

A processing station 124, 126 for performing the tag fabrication process 120 and a device performing an integrated process need not be stand alone devices dedicated to performing their own operations. It is also contemplated that one or more processing stations 124, 126 can be built into a host device which can perform the integrated process or processes. It is also contemplated that a device performing one or more integrated processes can be built into a system for performing the tag fabrication process 120. For example, one or more processing stations 124, 126 can be built into a host device, such as a printing device, at the time the host device is manufactured. The resulting integrated surface processing systems 167, 171 are thus adapted to print on the surface of an item, and fabricate a security tag on the surface of the item, as part of an integrated in-line process.

Additionally, a system performing the tag fabrication process 120 can be provided as a component of a device or a part of a component of a device performing an integrated function. For example, a processing station 124, 126 can be built into a component for insertion into a host device performing an integrated function, such as a processing station 124, 126 adapted to function as a roller for insertion into a host printing device. The component or part of a component including the processing station 124, 126 can be detachably secured to the host device or fixed to the host device.

In an especially advantageous preferred embodiment of the invention, a processing station 124, 126 can be integrated with a flexographic printing device to fabricate security tags at speeds of at least two orders of magnitude faster than conventional photo-etching fabrication processes. Furthermore, the ability to build a processing station 124, 126 into a roller for insertion into a flexographic printing device permits the fabrication of security tags at this greatly increased speed and without the large investment that would be required to obtain a new printing device manufactured with a processing station 124, 126 therein for performing the tag fabrication process 120.

The tag fabrication process 120 can be integrated with a process for preparing a surface of substrates adapted to be associated with an item to be monitored, in addition to the item itself. A surface processed by the tag fabrication process 120 can be associated with an item to be monitored by clipping or adhering it to the material of the item, by inserting it into the item or packaging containing the item, by merely placing it in the vicinity of the item or in any other manner. For example, the tag fabrication process 120 can be applied to pallets for transporting items or packaging materials for containing an item or items to be monitored; for example, to materials such as plastic, paper, cloth or cardboard, especially the cardboard of corrugated boxes.

When a surface processing system such as a surface processing system 167, 171 is being operated, it is sometimes useful to determine how many times an individual processing station 164, 176, 180 is operated, or more specifically, how many security tags are fabricated by the surface processing system 167,171. Many different counting mechanisms are known to those skilled in the art for making these determinations. For example, the number of rotations or other movements of a rotary adhesive transfer device or a rotary die cutter can be counted using a conventional rotation counter. If a processing station 124, 126 is inserted into a roller of a printer such as a flexographic printer, the number of rotations of the roller can be counted. Additionally, the number of items processed by the surface processing system 167,171, regardless of how many items receive a security tag, can be determined by conventional suitable counting devices disposed at suitable locations within the integrated devices.

Figure 10:
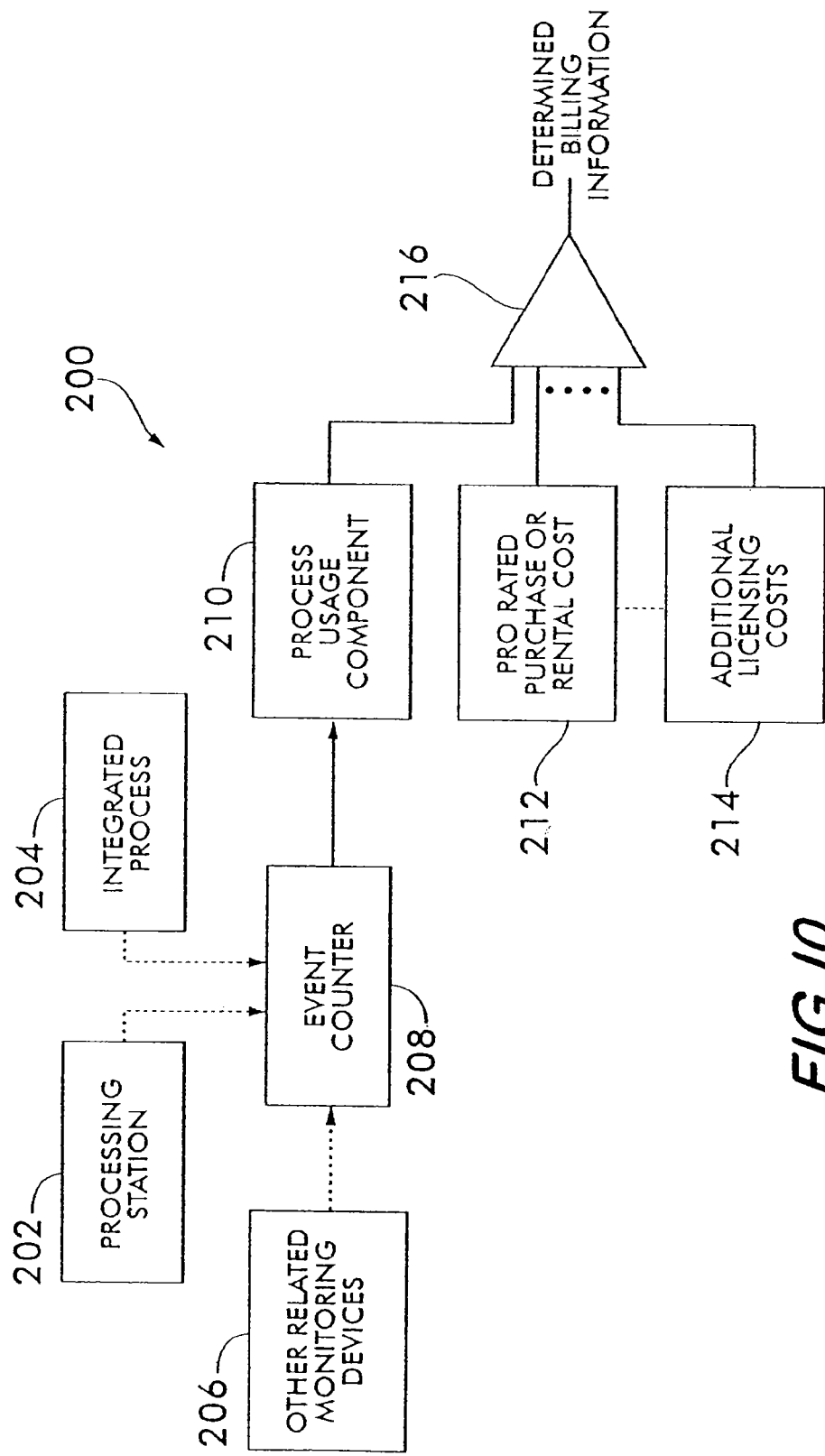
FIG. 10 is a block diagram representation of billing models for billing the costs for using the method of the present invention.

Referring now to FIG. 10, there is shown the billing model 200 for determining billing information for users of the tag fabrication process 120. The costs for using the tag processing process 120 can be determined and billed to a user of the system 120 in many ways. One method for billing the user is to include the costs of the fabricating process 120 in a sale or rental of equipment adapted to perform the process 120. For example, a processing station 124, 126, along with any number of additional processing stations and integrated processes, can be included within a flexographic printer purchased by a user in order to fabricate security tags. Purchase of the equipment adapted to perform the tag fabricating process 120 can thus give the purchaser the right to use the purchased equipment to perform the tag fabricating process 120.

Alternately, the user of the tag fabricating process 120 can be billed on a usage basis, such as a per-tag-basis. A usage cost determined in this manner can be either instead of or in addition to the foregoing costs incorporated into the cost or the rent of the equipment. In order to determine the usage costs in this embodiment of the billing models 200, the number of security tags fabricated by the user of the process 120 can be counted. For example, any conventional counter can be inserted into a roller or other device for performing the adhesive transfer functions or the die cutting functions of a processing station 124, 126. Alternately, the usage costs can be determined by monitoring the amount of adhesive, conductor, substrate or any other resource supplied to a processing station 124, 126, such as electricity. Furthermore, the usage costs can be determined by monitoring any of the operations of any integrated process, by measuring the time of operation of the tag fabricating process 120, the number of fabricated tags that are operating correctly, or any other operation or method.

It will be understood that the methods set forth for determining the usage cost for billing a user of the tag fabrication process 120 are for illustrative purposes only and are not intended to be exhaustive. For example, in the embodiment of the tag fabrication process 120 in which the user selectably applies a security tag to a varying percentage of the items being processed by an integrated process, the costs can be determined on a per-item-basis, a per-tag-basis, or any other basis, including discounts based upon usage volume. Similarly, if a user is applying plural security tags to items, either selectably or to all of the items, the costs can be determined on the same bases. In another alternate embodiment of the invention, wherein preformed circuit elements such as coils or plates are disposed on a substrate during the fabrication process, the number of such circuit elements supplied to the fabrication process can be counted. Alternatively, a user of the present invention can be required to purchase such preformed elements or materials from a predetermined seller in order to determine the number of circuit elements used for purposes of obtaining billing information.

The output information of suitable counting an/or measuring devices within a processing station 202, an integrated process 203 and/or any other related monitoring devices 206 is applied to an event counter 208 for obtaining a measure of the amount of usage of the tag fabrication process 120. The usage component of the costs within the billing models 200 is provided at the output of the event counter 208 and applied to a process usage component block 210.

Additional costs, if any, are also determined within the billing models 210. For example, costs due to any purchase or rental agreements can be determined at block 212 and any additional agreed upon licensing costs can be determined at block 214. The licensing can be licensing of tag designs, tag design tools or any other properties, including know-how. Any other additional costs agreed to can also be determined at this point. The output of the blocks 210, 212 and 214 are applied to the input of the summation device 216 to provide the determined billing for the tag fabrication process 120.

Figure 11:
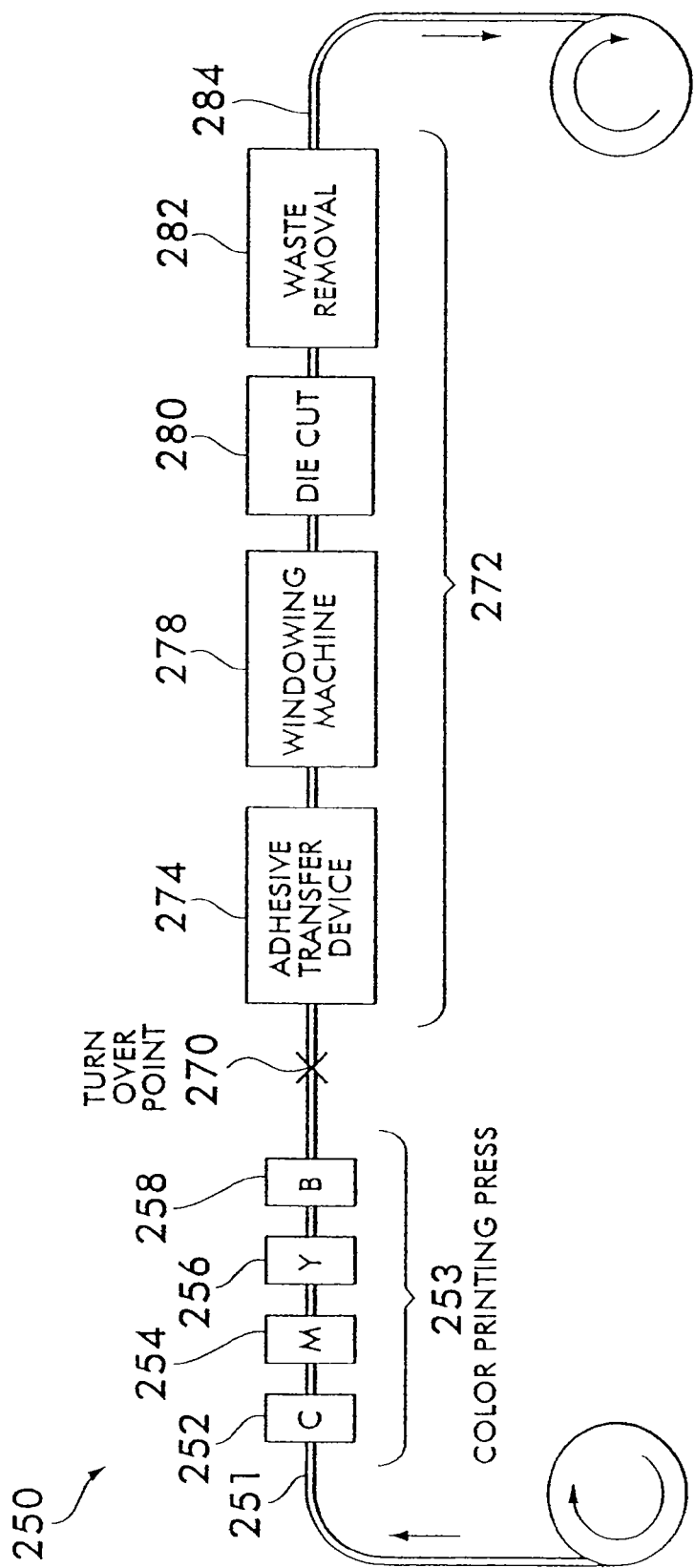
FIG. 11 is a schematic representation of a color printing press and security tag fabrication system for applying colored ink patterns and circuit elements to the surfaces of a substrate in accordance with the system and method of the present invention.

Referring now to FIG. 11, there is shown a schematic representation of a surface processing system 250 including a color printing press 253 and a tag fabrication processing station 272 for applying color ink patterns and circuit elements to a surface of a substrate 251 to fabricate security tags according to the present invention. The substrate 251 can be any suitable substrate material. For example, the substrate 251 can be plastic, paper or a cardboard, preferably a corrugated cardboard. Within the printing press 253, cyan 252, magenta 254, yellow 256 and blue 258 inks are applied to a surface of the substrate 251 in order to provide the printed colored patterns on the surface thereof. The substrate 251 can be flipped over at turnover point 270 of the surface processing system 250 in order to permit the remaining operations of the surface processing system 250 to be performed on the surface of the substrate 251 opposite the surface to which the color pattern is applied by the printing press 253.

Within the tag fabrication station 272, a patterned adhesive can be applied to a surface of the substrate 251 by an adhesive application device such as the adhesive transfer device 274. A windowing machine 278 can be provided within the surface processing station 250 in order to place preformed circuit elements, for example, capacitor plates, antennas or coils including nested coils on the surface of the substrate 251. The windowing machine 278 can be the conventional type of windowing machine well known by those skilled in the art for placing, for example, cellophane windows on envelopes using a transferring vacuum drum. The use of a windowing machine 278 is especially advantageous within the surface processing system 250 because it permits the placement of circuit elements of many differing sizes and shapes upon the substrate 251 without making substantial changes to the tag fabrication station 272.

Furthermore, the use of a windowing machine 278 permits the fabrication process of the station 272 to be easily changed from one size or shape of circuit element to another. For example, using a windowing machine 278, it is possible to very easily switch from a fabrication process requiring one inch strips to a process requiring three inch strips, by providing a continuous strip of conductive foil which is cut to the required size and placed at the required location by the vacuum drum for each individual circuit. It is possible to easily switch from one shape of circuit element to another by merely applying separate pieces of circuit elements of differing shapes to the windowing machine as required, for example by disposing the circuit elements on a carrier in order to apply them to the windowing machine 278.

A die cutter 280 within the surface processing system 250 can then be used to cut around the shape and the waste produced thereby is removed at the waste removal station 282. This results in a substrate 284 carrying a semi-finished product such as, for example, coils including inductor coils, capacitor plates or antennas.

Figure 12:
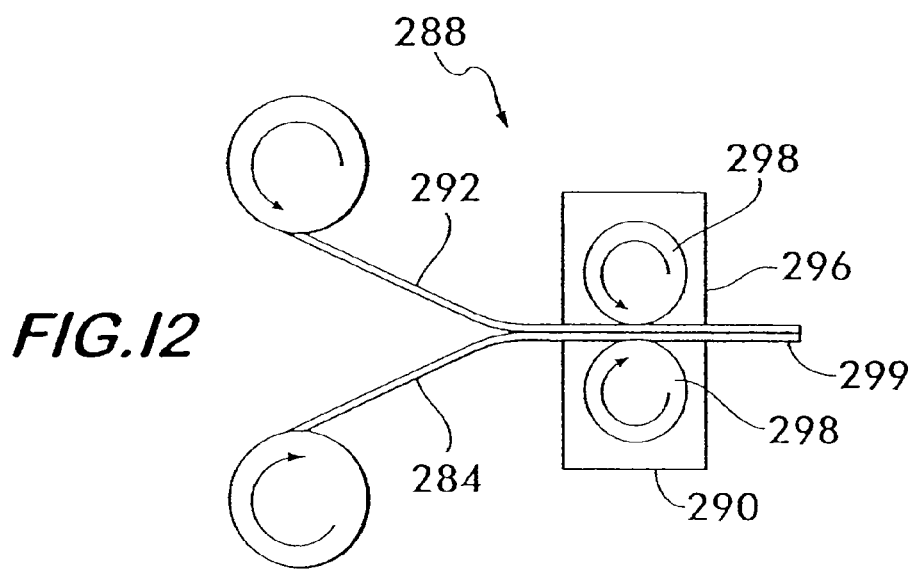
FIG. 12 is a schematic representation of an input stage of a security tag fabrication system for applying circuit elements to a substrate in accordance with the method of the invention.
Figure 13A:
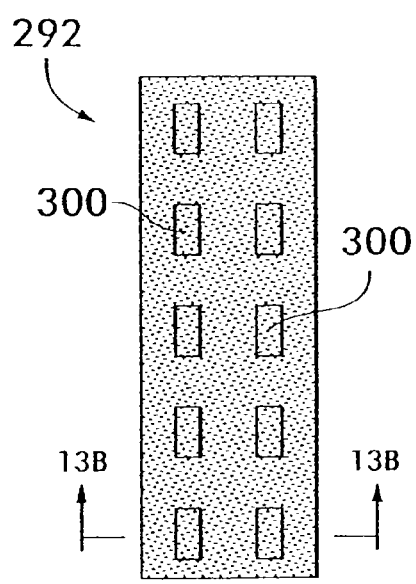
FIGS. 13A and 13B show plan and cross-sectional views, respectively, of a carrier bearing circuit elements for fabricating exemplary security tags in accordance with the system and method of the present invention.
Figure 13B:
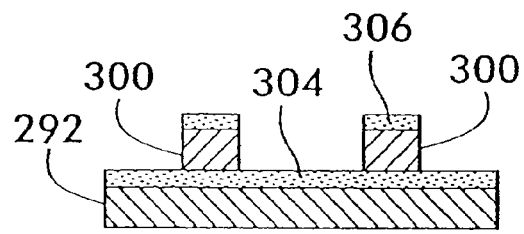

Referring now to FIGS. 12, 13A and 13B, there is shown an input stage 288 of a surface processing system for fabricating security tags according to the present invention, as well as plan and cross-sectional views of a carrier 292 for carrying a supply of circuit elements 300 to the input stage 288. The circuit elements 300 can be, for example, capacitor plates, coils, antennas or fuses for fabricating security tags, including RFID security tags. The input stage 288 can also receive a semi-finished product, such as the semi-finished product disposed on the carrier 284 provided by the surface processing system 250.

The carrier 292 and the carrier 284 are applied to a hot stamp coil saver 296 within the input stage 288. The circuit elements 300 disposed on the carrier 292 can thus be applied to the circuit elements disposed on the carrier 284 to form resonant circuits for security tags.

The circuit elements 300 are preferably disposed as close as possible to each other on the carrier 292 in order to conserve space. The motion of the carrier 284 and/or the motion of the carrier 292 into the hot stamp coil saver 296 are controlled using servo motors (not shown) in order to provide the proper registration between the circuit elements on the carrier 284 and the circuit elements on the carrier 292. In one application of the input stage 288, capacitor plates can be heat sealed onto coils using the rollers 298 within the hot stamp coil saver 296 when proper registration is achieved. Heat can be applied in the same shape as the circuit elements 300.

In the preferred embodiment of the invention, the circuit elements 300 can be adhered to the carrier 292 by an adhesive layer 304. A further adhesive layer 306 can be provided on the opposite surface of the circuit elements 300 in order to assist in bonding the circuit elements 300 to, for example, inductor coils. It will be understood that the adhesive between the circuit elements 300 and the inductor coils can be provided on the surface of the circuit elements 300, on the surface of the inductor coils, or on both surfaces. Furthermore, it will be understood that the adhesive between the circuit elements 300 and the coils can be an adhesive dielectric.

Referring now to FIG. 14, there is shown a surface processing system 320 for fabricating security tags in accordance with the present invention. A die cutter 328 within the surface processing system 320 can receive a conductive foil 324 and form circuit elements, such as the circuit elements 300 (see FIGS. 13A and 13B). Thus, the die cutter 328 can produce the previously described carrier 292. A waste take up roll 326 can remove the waste conductor foil produced by the die cutting process performed by the die cutter 328. It will be understood that the waste conductor foil on the waste take up roll 326 can be recycled into the die cutter 328 in order to more efficiently use the conductor foil 324.

The carrier 284 and the carrier 292 are applied to the hot stamp foil saver 296 of the surface processing system 320, substantially as previously described with respect to the input stage 288. The hot stamp foil saver 296 presses the carriers 284, 292 together, hot stamping the circuit elements 300 disposed on the carrier 292 onto the ones disposed on the carrier 284, as previously described, thus, providing the carrier 294 having resonant circuits suitable for use in security tags.

The carrier 294 can then be applied to a deactivation station 336 to provide capability and/or test deactivation effectiveness within the circuits formed by the hot stamp foil saver 296. A preferred deactivation point can be created by scratching one or both sides of the dielectric, for example using a mechanical process, whereby two traces are brought closer together. The mechanical process can use a dimpling process to bring two conductive traces relatively closer to each other at a selected point or any other mechanical technique. Any tests of deactivation effectiveness can be performed on a predetermined percentage of the circuits, for example, one circuit out of a thousand. The percentage of circuits which do not deactivate can thus be determined. A weld station 340 can be provided within the surface processing system 320.

An inspection of the circuits formed on the carrier 294 by the hot stamp foil saver 296 can be performed at the inspection station 344. The inspection station 344 can test any circuit parameter or parameters desired. The inspection performed by the inspection station 344 can be used to identify defective circuits disposed on the carrier 294, as well as to perform any metering functions desired. Additionally, the inspection station 344 can be used to provide feedback to earlier stages of the surface processing system 320, or to provide a feed forward signal to later stages, for adjusting and controlling any circuit parameters desired. In addition to being used to correct circuits being formed by the surface processing system 320 (e.g. by changing registration or trimming) the inspection station 344 can be used to mark any defective circuits it locates, or even to repair such defective circuits. A die cutter 346 can also be provided.

In an alternate embodiment of the invention (not shown), the surface processing station 320 can be modified by removing the die cutter 328 and the hot stamp foil saver 296, and substituting in their place an in line printing station for applying a conductive ink to the circuit elements disposed on the carrier 284. In this manner, it is possible to form, for example, a plate of a capacitor over a coil disposed on the carrier 284 from the conductive ink.

The metering functions performed within the inspection station 344 or any other operations within the system 320 can be coupled to a communication channel 250 in order to permit monitoring of a tag fabrication process being performed by a system such as the surface processing system 320. Monitoring by way of the communication channel 250 can be performed at a location within the system 320, external to the system 320 at another location in a plant or installation where the system 320 is disposed, or at a location remote from the location where the system 320 is disposed.

The communication channel 250 can be an internet connection, a broadcast link such as a radio frequency link or a microwave link, a telephone connection, an electrical wire, an optical link, or any other unidirectional or bidirectional system for communicating data. Thus, the quality as well as the quantity of the tags being fabricated by the fabrication process such as the processes performed by the surface processing system 300 can be monitored from any location.

Data collected in this manner by the surface monitoring system 320 can be applied as an input to the billing model 200 for determining billing information. Thus, the communication channel 250 can permit billing information to be determined locally or remotely. Additionally, since the information transmitted by the surface processing system 320 can include center frequency, quality factor Q, signal amplitude and deactivation effectiveness as well as any other parameter, the inspection station 344 can permit a licensor of the tag fabrication process of the present invention to monitor the quality as well as the quantity of tags being fabricated by a licensee.

Referring now to FIG. 15, there is shown the capacitor 360 which is suitable for use in a security tag. The capacitor 360 can be formed according to any one of the preferred embodiments of the present invention or by any other fabrication process known to those to those skilled in the art. The capacitor 360 includes a bottom plate 372, a dielectric layer 370 and a top plate 366. The bottom plate 372 can be disposed upon a surface 362a of a substrate 362. Furthermore, the bottom plate 372 can be disposed directly upon the surface 362a or upon one or more intervening layers disposed between the bottom plate 372 and the surface 362a.

In prior art, it is known to achieve alignment of the plates 366, 372 in many ways. For example, alignment indicia on a package or substrate can be used, thereby allowing for a fiducial or barcode type structure. However, when fabricating capacitors, failure to correctly align the top and bottom plates of the capacitor, for example due to manufacturing variations, could result in substantial variations in the value of the capacitance produced. Variations in the value of the capacitance result in unwanted shifts in the resonant frequency of a circuit. The manufacturing variations can be due to differing design considerations, the tolerances of a design process, or other factors.

In a preferred embodiment of the invention, the top plate 366 of the capacitor 360 is formed substantially small compared to the bottom plate 372. Additionally, the top plate 366 is disposed at a location offset from an edge of the bottom plate 372 in at least one planar dimension of the surface plane of the bottom plate 372. Preferably, the top plate 366 is offset from the edges of the bottom plate 372 in both orthogonal planar directions of the bottom plate 372. The magnitudes of the offset or offsets are selected according to the expected variations in the positioning of the top plate 366 relative to the bottom plate 372.

In the preferred embodiment, the magnitude of the offset is selected such that at least a portion of the bottom plate 372 continues to be disposed below the entire surface area of the top plate 366 when the positioning of the top plate 366 over the bottom plate 362 is within the expected variations. In this configuration, the entire surface of the top capacitor plate 366 faces an opposing area of the bottom plate 372 as long as the variations in the positioning are within the expected range. Thus, the effective capacitor plate area for determining the capacitance of the capacitor 360 remains substantially equal to the area of the top plate 366 regardless of variations in the alignment of the plates 366, 372. This results in the value of the capacitance of the capacitor 360 being substantially unchanged due to such variations in the relative alignment of the plates 366, 372.

The plate 366 is described herein as the top plate of the capacitor 360 and the plate 372 is described as the bottom plate for illustrative purposes only. It will be understood by those skilled in the art that a lower plate of a capacitor can be formed substantially smaller than a top plate, and preferably offset from the edges of the larger plate in at least one planar direction in order to obtain the advantageous results of the invention. Furthermore, it will be understood that the plates 366, 372 can be disposed on opposing sides of any dielectric material, such as the opposing sides of the substrate 362.

It will be understood that the word "security" in security tag is broader than a tag for providing security against theft. The tag can be any tag providing a signal to indicate its presence or other information about itself or an item with which it is associated for any purpose. Furthermore, the method of the invention can be used to fabricate any circuit or circuit element and is not limited to circuits within tags.

While the invention has been described in detail and with reference to specific examples thereof, it will be apparent to one skilled in the art that various changes and modifications can be made therein without departing from the spirit and scope thereof.

What is claimed is:

1. A process for forming at least a portion of a package or envelope bearing printed indicia, a label bearing printed indicia or a sheet bearing printed indicia, said process comprising:
   (A) providing a substrate which constitutes a portion of said package, label or sheet to a printing apparatus,
   (B) printing indicia on said substrate utilizing said printing apparatus or an adjunct to said printing apparatus cooperatively located with respect to said printing apparatus, and
   (C) fabricating at least one electrically conductive component of a tag on said substrate substantially simultaneously with the printing of said indicia on said substrate, whereby said substrate receives both said indicia and said electrically conductive component of said tag substantially simultaneously.

2. The process of claim 1 wherein said fabricating of said at least one electrically conductive component on said substrate is accomplished slightly prior to the printing of said indicia on said substrate.

3. The process of claim 1 wherein said fabricating of said at least one electrically conductive component on said substrate is accomplished slightly after the printing of said indicia on said substrate.

4. The process of claim 1 wherein said fabricating of said at least one electrically conductive component on said substrate is accomplished at the same time as the printing of said indicia on said substrate.

5. The process of claim 1 wherein said fabricating of said at least one electrically conductive component on said substrate is accomplished by:
   (D) applying an adhesive to said substrate in a pattern desired for said at least one electrically conductive component,
   (E) applying an electrically conductive layer to said adhesive pattern to cause at least a portion of said electrically conductive layer to be secured to said adhesive pattern, and
   (F) removing those portions of said electrically conductive layer that are not secured to said adhesive pattern.

6. The process of claim 5 comprising die-cutting said electrically conductive layer about the periphery of said at least a portion of said electrically conductive layer that is secured to said adhesive pattern prior to removing those portions of said electrically conductive layer that are not secured to said adhesive pattern.

7. The process of claim 1 wherein said at least one electrically conductive component of said tag comprises a coil or a portion of a coil.

8. The process of claim 1 wherein said at least one electrically conductive component of the tag comprises an antenna or a portion of an antenna.

9. The process of claim 1 wherein said at least one electrically conductive component of said tag comprises a plate of a capacitor or a portion of a plate of a capacitor.

10. The process of claim 1 wherein said tag comprises an EAS tag.

11. The process of claim 1 wherein said tag comprises an RFID tag.

* * * * *